(12) United States Patent
Watanabe

(10) Patent No.: US 6,226,230 B1
(45) Date of Patent: May 1, 2001

(54) TIMING SIGNAL GENERATING APPARATUS AND METHOD

(75) Inventor: Naoyoshi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/340,942

(22) Filed: Jun. 28, 1999

(30) Foreign Application Priority Data

Jun. 26, 1998 (JP) .................................................. 10-180086

(51) Int. Cl.⁷ .............................. G04F 8/00; G04F 10/00; H03K 3/17; H03K 3/26
(52) U.S. Cl. .......................... 368/113; 327/175; 327/263; 327/291
(58) Field of Search .................................... 368/157, 113; 327/114, 116, 172–175, 263, 291

(56) References Cited

U.S. PATENT DOCUMENTS 5,336,939 * 8/1994 Eitrheim ................................ 307/269
5,359,232 * 10/1994 Eitrheim ................................ 307/268

* cited by examiner

Primary Examiner—Vit Miska
(74) Attorney, Agent, or Firm—Gallagher & Lathrop; David N. Lathrop

(57) ABSTRACT

A timing signal generating apparatus capable of automatically detecting any erroneous set state that a pulse duration of a test pattern signal and a time duration between adjacent two pulses of the test pattern signal have been set in a program with the durations being shorter than corresponding limit values respectively, and a method of detecting any set error to the program for a timing signal. At the outside of a clock generator 113A for generating a set pulse $P_S$ and a reset pulse $P_R$ are provided a fourth latch circuit 16 for latching therein an integer delay signal MT outputted from a down-counter 11 of an integer delay giving device 10, and a fifth latch circuit 17 for latching therein an odd value MDAT outputted from a first latch circuit 12 of the integer delay giving device 10, thereby to detect a time duration from the set pulse until the reset pulse or a time duration from the reset pulse until the set pulse. If the time duration is shorter than a limit value $WMT_1$ or $WMT_2$, a logical signal indicating a set error is generated.

26 Claims, 12 Drawing Sheets

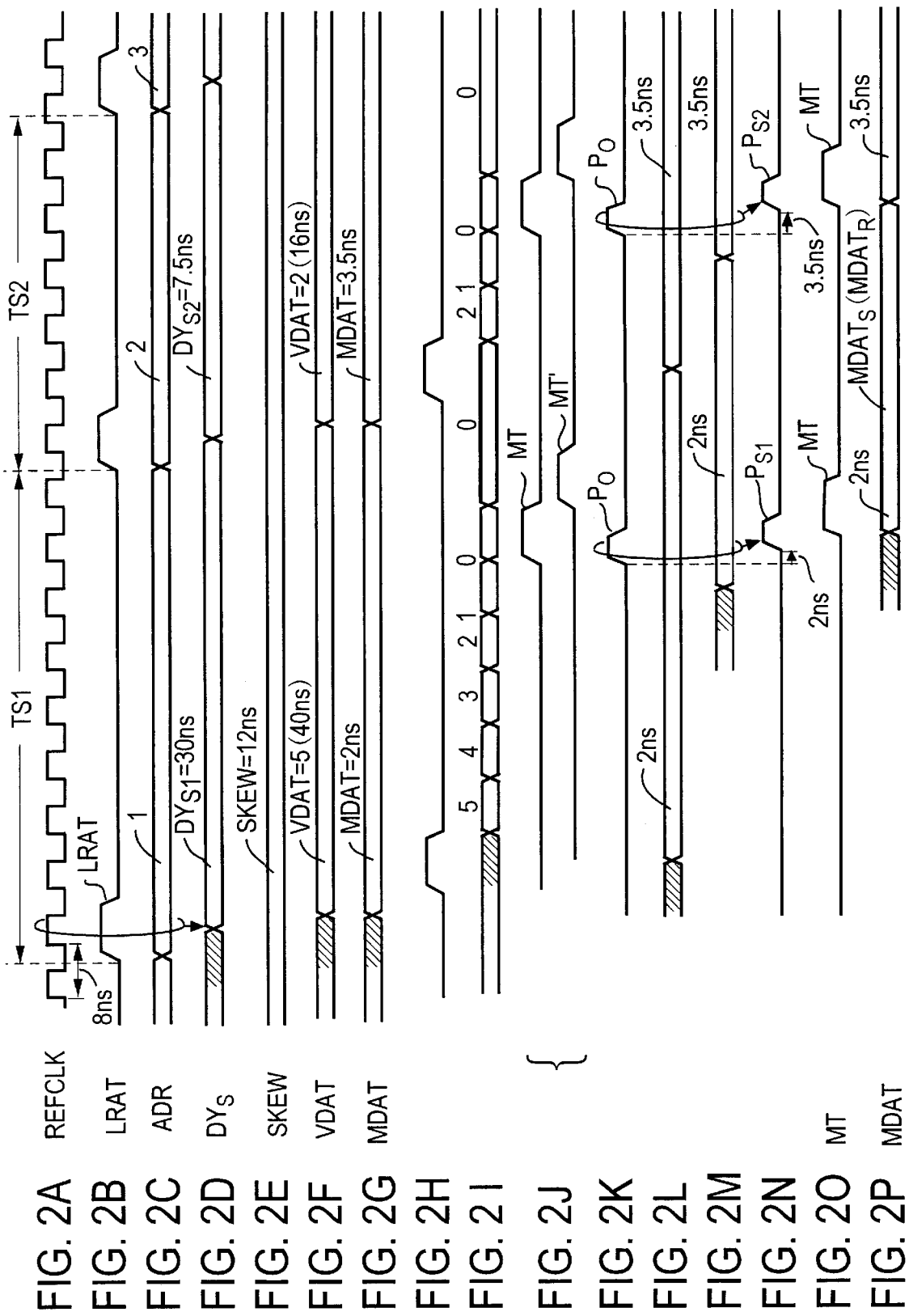

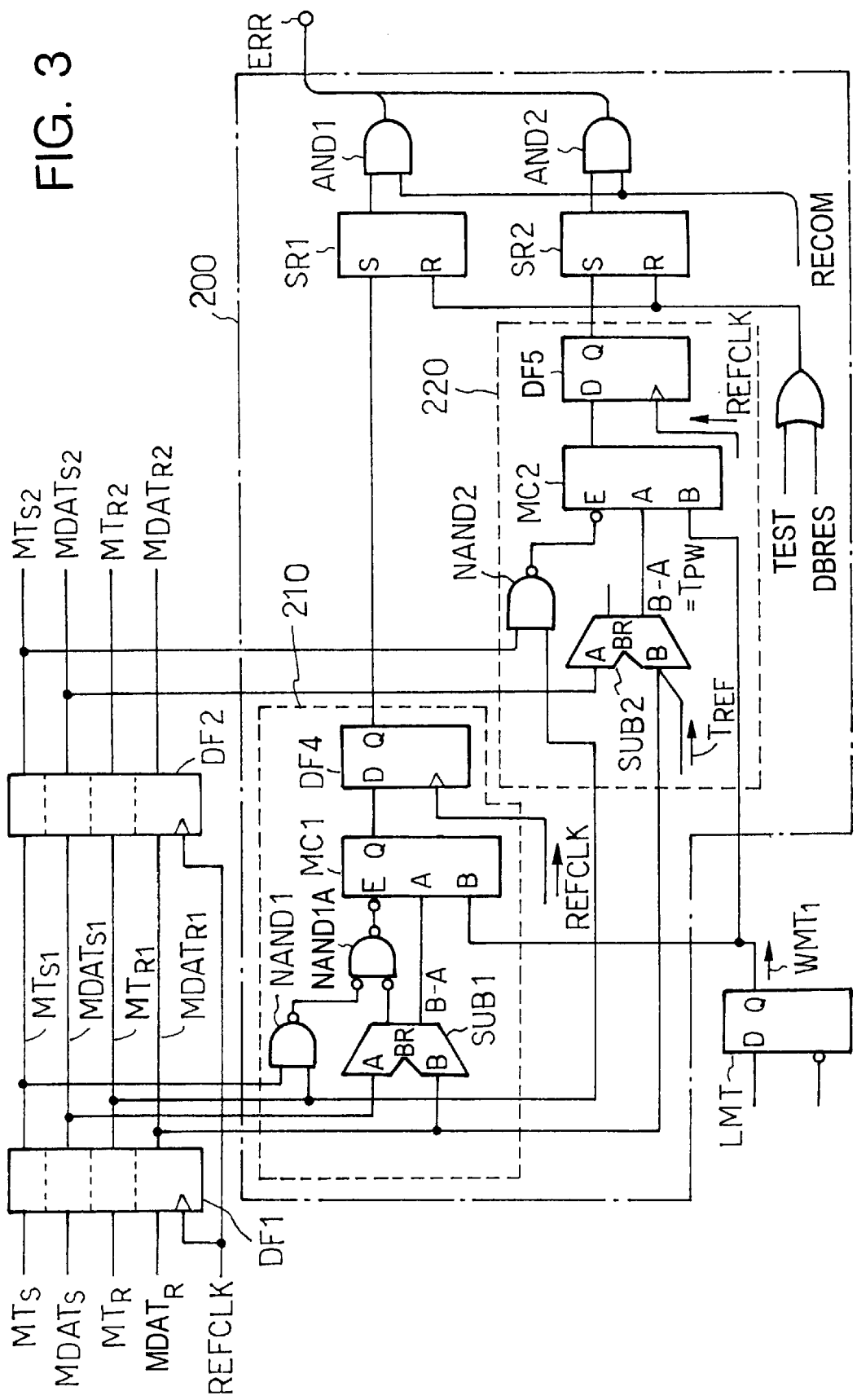

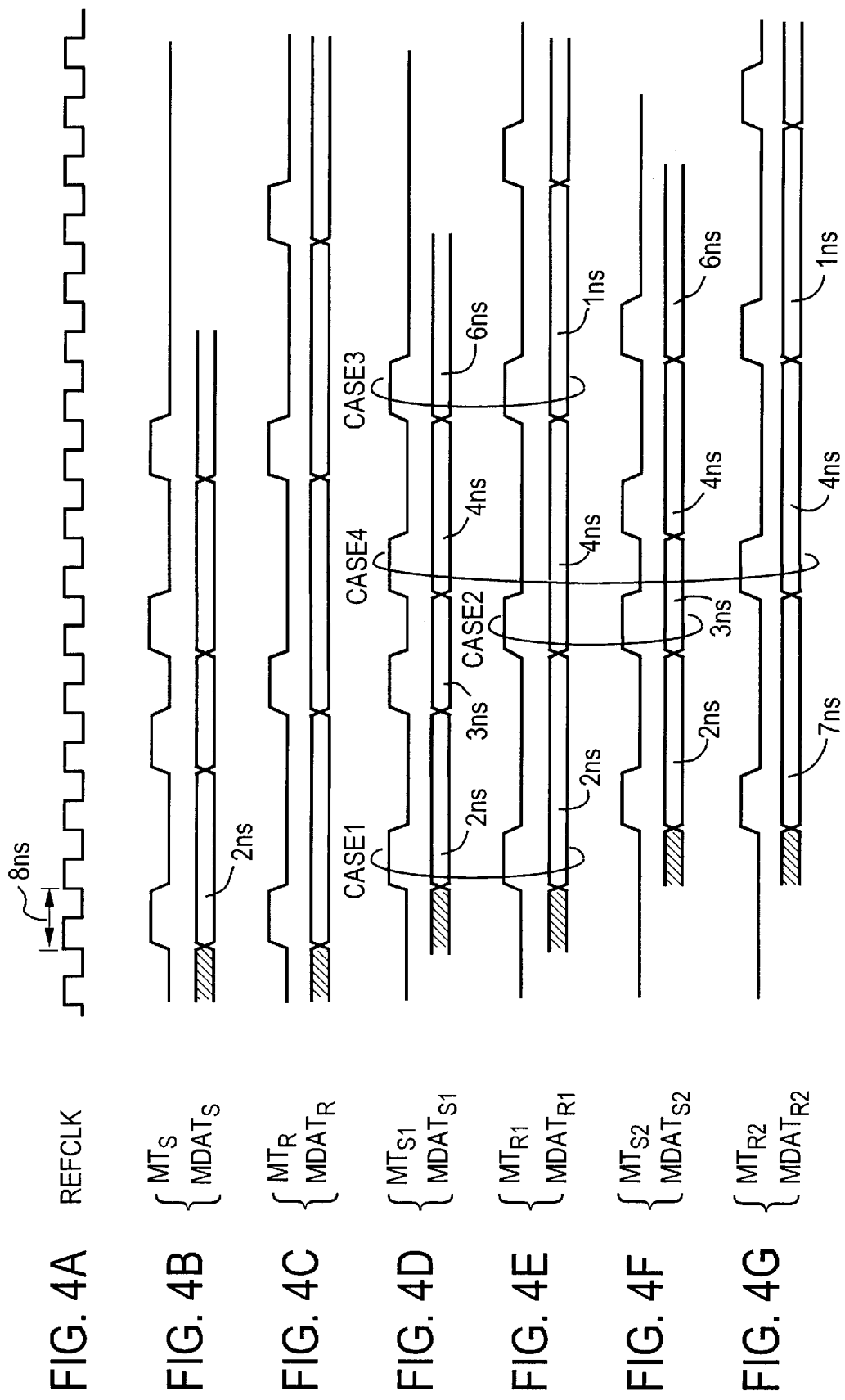

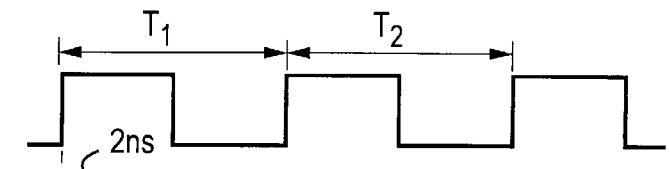
FIG. 5A REFCLK
FIG. 5B P_S
FIG. 5C P_R
FIG. 5D TP
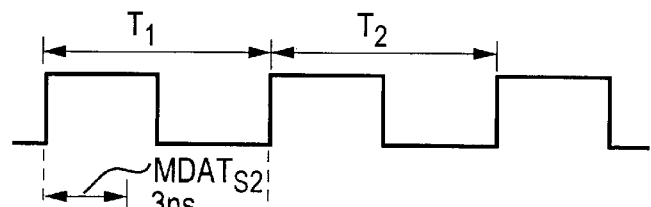
FIG. 6A REFCLK
FIG. 6B P_S
FIG. 6C P_R
FIG. 6D TP

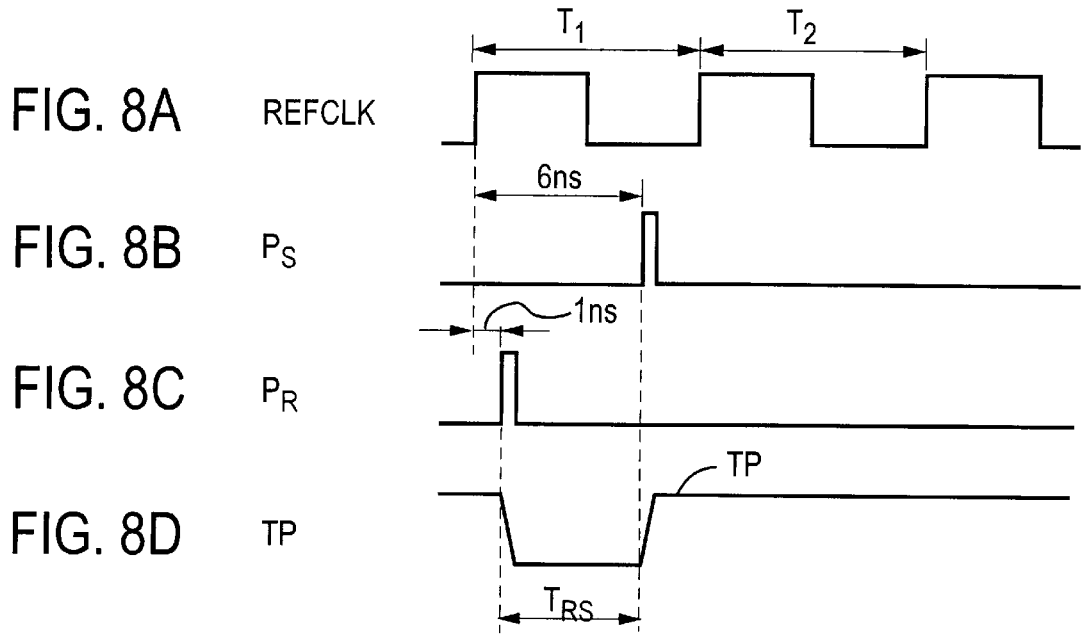
FIG. 8A REFCLK
FIG. 8B P_S
FIG. 8C P_R
FIG. 8D TP
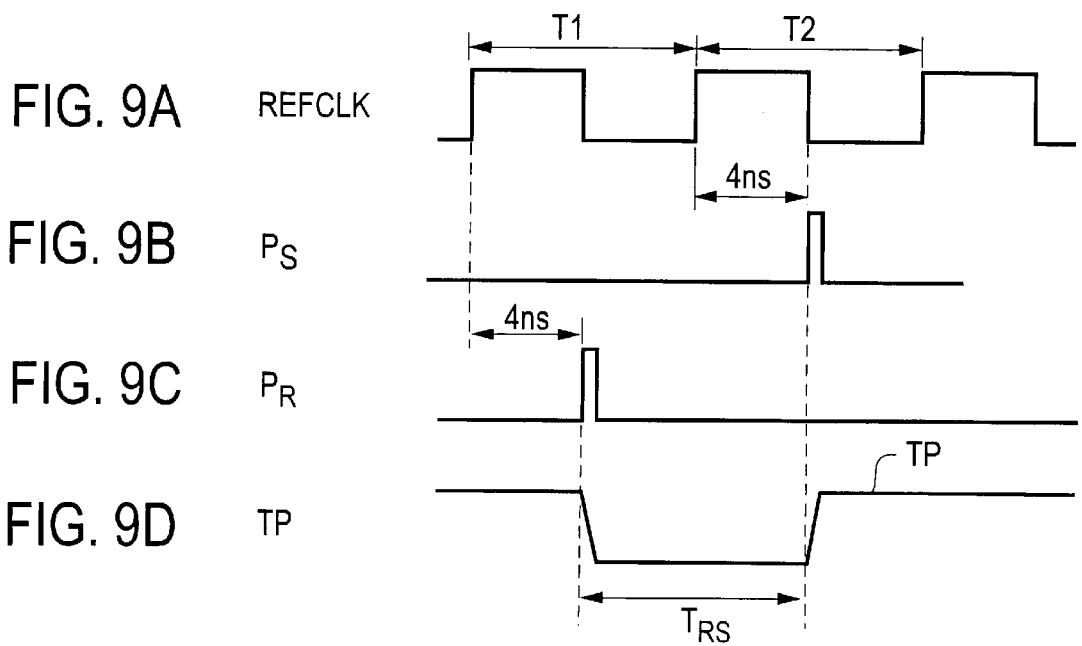
FIG. 9A REFCLK
FIG. 9B P_S
FIG. 9C P_R
FIG. 9D TP

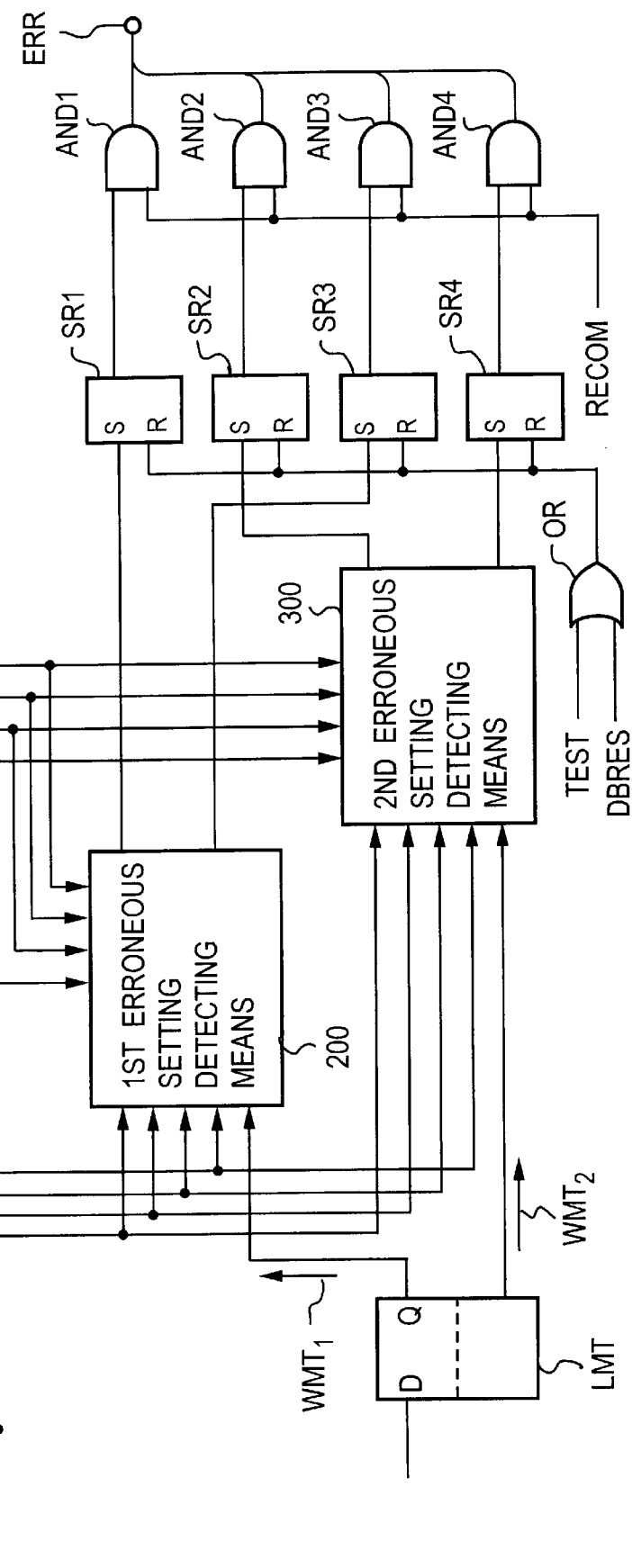

FIG. 12
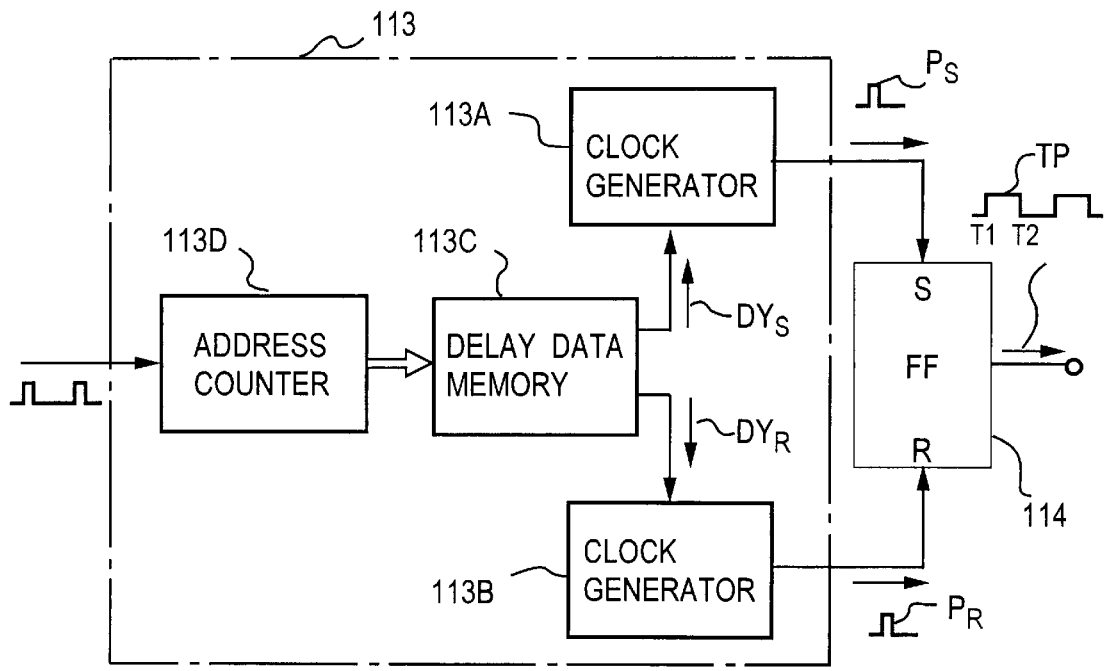
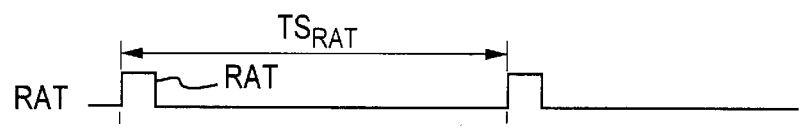
FIG. 13A  RAT
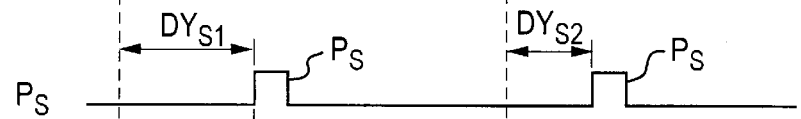
FIG. 13B  $P_S$
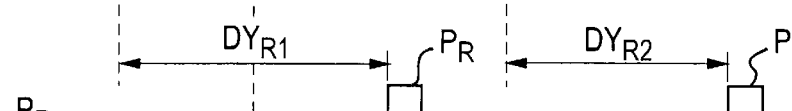
FIG. 13C  $P_R$
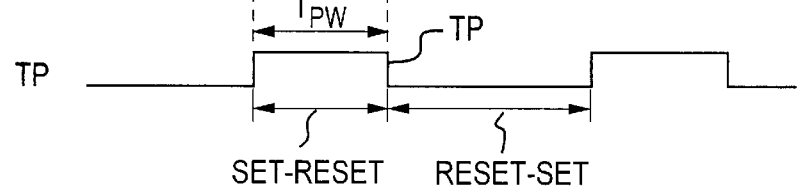
FIG. 13D  TP

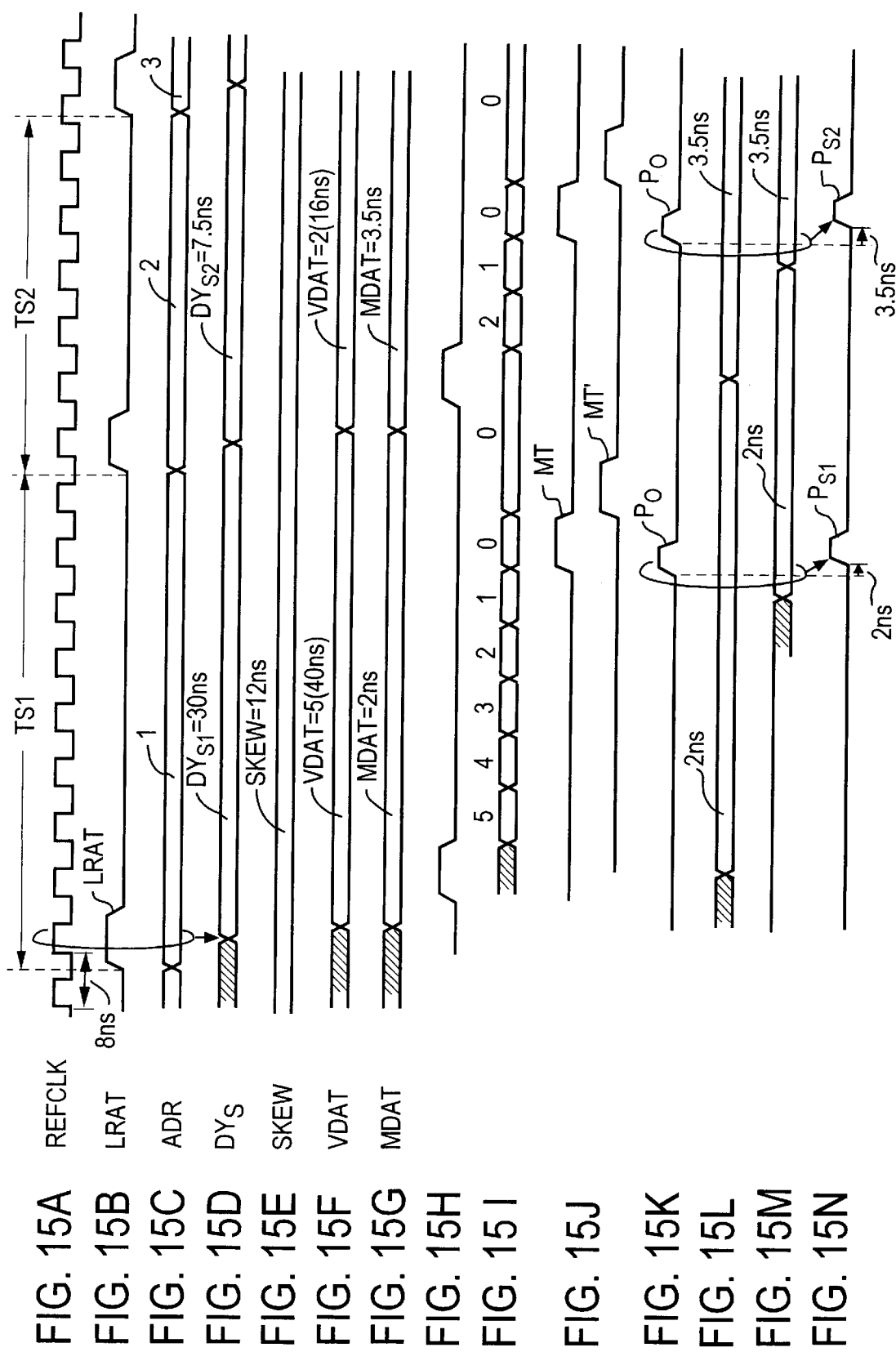

TIMING SIGNAL GENERATING APPARATUS AND METHOD

BACKGROUND OF THE INVENTION

1. Field of the Invention

The present invention relates to a timing signal generating apparatus for generating a timing signal on the basis of a program, a method of detecting any set error to the program for a timing signal, and a semiconductor device testing apparatus using such timing signal generating apparatus. More particularly, the present invention relates to a timing signal generating apparatus provided with a set error detecting means being capable of immediately detecting any description error that may exist in a preset program, a method of detecting any set error to the program for a timing signal, and a semiconductor device testing apparatus using such timing signal generating apparatus.

2. Description of the Related Art

A timing signal generating apparatus for generating a timing signal on the basis of a program is used in, for example, a semiconductor device testing apparatus for testing a semiconductor device. FIG. 11 shows an example of a conventional semiconductor device testing apparatus (hereinafter referred to as an IC tester) for testing a semiconductor integrated circuit element (hereinafter referred to as an IC) which is a typical example of a semiconductor device. This IC tester TES comprises, roughly speaking, a main controller 111, a pattern generator 112, a timing generator 113, a waveform formatter 114, a logical comparator 115, a driver group 116, an analog level comparator group 117, a failure analysis memory 118, a logical amplitude reference voltage source 121, a comparison reference voltage source 122, and a device power supply 123.

The main controller 111 is generally comprised of a computer system and mainly controls the pattern generator 112 and the timing generator 113 in accordance with a test program PM created by a user.

First of all, prior to starting an IC test, a set of various data is performed by the main controller 111. After those various data are set, the IC test is started. By supplying a test start command from the main controller 111 to the pattern generator 112, the pattern generator 112 starts to generate a pattern. Therefore, a time point when the pattern generator 112 starts to generate a pattern is a time point when the test is started. The pattern generator 112 supplies a test pattern data to the waveform formatter 114 in accordance with the test program. On the other hand, the timing generator 113 generates a timing signal (clock pulses) for controlling the operation timings of the waveform formatter 114, the logical comparator 115 and the like.

The waveform formatter 114 converts a test pattern data supplied from the pattern generator 112 to a test pattern signal having a real waveform. This test pattern signal is applied to an IC under test (generally referred to as a DUT) 119 via the driver group 116 for amplifying voltage of the test pattern signal to a waveform having an amplitude value set in the logical amplitude reference voltage source 121, and is stored in a memory of the IC under test 119.

On the other hand, a response signal read out from the IC under test 119 is compared by the a logical comparator 117 with the a reference voltage supplied from the comparison reference voltage source 122 to determine whether or not the response signal has a voltage of a predetermined logical level (a voltage of logical H (logical high) or a voltage of logical L (logical low)). The response signal determined to have the predetermined logical level is sent to the logical comparator 115, where the response signal is compared with an expected value pattern signal outputted from the pattern generator 112.

If the response signal is not equal to the expected value pattern signal, a memory cell having an address of the IC under test 119 from which the response signal was read out is determined to be in failure, and a failure signal indicating this is generated. Usually this failure signal is expressed by a logical "1" signal, and is stored in the failure analysis memory 118. A failure signal is generally stored in an address of the failure analysis memory 118 that is same as that of the IC under test 119.

On the contrary, if the response signal is equal to the expected value pattern signal, a memory cell having an address of the IC under test 119 from which the response signal was read out is determined to be normal, and a pass signal indicating this is generated. This pass signal is expressed by a logical "0" signal, and is not usually stored in the failure analysis memory 118.

When the test is completed, the failure signals stored in the failure analysis memory 118 are read out therefrom, then, for example, whether or not a relief of the failure memory cells of the tested IC 119 is possible is determined.

The timing generator 113 generates a timing signal (clock pulses) for defining a rising timing and a falling timing of the waveform of the test pattern signal to be applied to the IC under test 119, a timing signal (clock pulse) of a strobe pulse for defining a timing of a logical comparison between the response signal and the expected value pattern signal in the logical comparator 115, and the like.

The IC tester is constructed such that the timings and/or periods for generating those timing signals are described in a test program PM created by the user, and the test pattern signal is applied to the IC under test 119 at operation periods and timings intended by the user to operate the IC under test, and in addition, a test can be performed to see if the operation is normal.

Next, an outline of the timing generator 113 and the waveform formatter 114 will be described with reference to FIG. 12. FIG. 12 shows a schematic configuration of the waveform formatter and the timing generator for generating one channel test pattern signal. As illustrated, the waveform formatter 114 can be constituted by an S-R (set/reset) flip-flop FF, which can generate a test pattern signal TP rising at a predetermined timing T1 and falling at a predetermined timing T2 by supplying a set pulse $P_S$ to its set terminal S and by supplying a reset pulse $P_R$ to its reset terminal R.

Those set pulse $P_S$ and reset pulse $P_R$ are generated by a pair of clock generators 113A and 113B, respectively. Delay data $DY_S$ and $DY_R$ read out from a delay data memory 113C are supplied to those clock generators 113A and 113B, respectively, and a generation timings of the set pulse $P_S$ and the reset pulse $P_R$ are defined by the delay data $DY_S$ and $DY_R$, respectively.

The delay data memory 113C is accessed by an address signal supplied from an address counter 113D. The address counter 113D generates, from the test starting time, an address signal the address of which is incremented by +1 in every test period $TS_{RAT}$ (refer to FIG. 13). Therefore, the delay data memory 113C is accessed, in every test period $TS_{RAT}$ during the test, by the address signal the address of which is incremented by +1 in the sequential order, and the delay data $DY_S$ and $DY_R$ set therein in advance are read out therefrom in every test period $TS_{RAT}$. Those delay data $DY_S$ and $DY_R$ are set in the clock generators 113A and 113B, respectively, and the set pulse $P_S$ and the reset pulse $P_R$ are generated based on those delay data, respectively.

The above operation will be described with reference to FIG. 13. The clock generator 113A generates a set pulse $P_S$ shown in FIG. 13B at a timing delayed by the set delay data $DY_{S1}$ from, for example, a rising timing of a rate clock RAT shown in FIG. 13A defining a test period $TS_{RAT}$ during the test. In addition, the clock generator 113A generates a reset pulse $P_R$ shown in FIG. 13C at a timing delayed by the set delay data $DY_{R1}$ from a rising timing of the rate clock RAT. By the above operation, a test pattern signal TP shown in FIG. 13D having a pulse duration corresponding to a time difference $T_{PW}$ from a generation timing of the set pulse $P_S$ to a generation timing of the reset pulse $P_R$ is generated by the waveform formatter 114.

In such a way, the rising timing and the falling timing of the test pattern signal TP are defined, in every test period $TS_{RAT}$, by the delay data $DY_S$ and $DY_R$, respectively. For example, a test is performed to find how much the pulse duration of the test pattern signal TP can be made narrower for the normal operation of the IC under test, how much the generation time interval (the time difference from the generation timing of a reset pulse $P_R$ to a generation timing of a next set timing $P_S$) between the test pattern signals can be made small for the normal operation of the IC under test, or the like.

FIG. 14 is a block diagram showing in detail an internal configuration of the clock generator 113A for generating a set pulse $P_S$. Further, since an internal configuration of the clock generator 113B for generating a reset pulse $P_R$ is similar to that of the clock generator 113A, the configuration and the operation of the set side clock generator 113A will be described here.

The clock generator 113A comprises, dividing into large components, an integer delay giving device 10 for providing a delay time of an integer multiplied by one period of a reference clock REFCLK shown in FIG. 15A, the one period of the reference clock being used as a unit delay time, an odd delay giving device 20 provided at the output side of the integer delay giving device 10, and a summation processing device 30 provided at the input side of the integer delay giving device 10, a fixed value storage device 31 at the input side of the integer delay giving device 10, and a latch circuit 32 at the input side of the integer delay giving device 10. The odd delay giving device 20 provides a delay time smaller than one period of the reference clock REFCLK, and hence it provides a delay time of a residue which cannot be divided by one period of the reference clock REFCLK.

The integer delay giving device 10 comprises a down-counter 11 for decrementing (down-counting) an integer value VDAT supplied from the summation processing device 30, first and second latch circuits 12 and 13 connected in cascade for adjusting an output timing of an odd value MDAT supplied from the summation processing device 30, a third latch circuit 14 for latching therein an integer delay signal MT outputted from the down-counter 11, and an AND gate 15 for performing an AND operation of a delayed pulse MT' outputted from the third latch circuit 14 and an inverted pulse of the reference clock REFCLK.

The summation processing device 30 performs an operation process for dividing a delay data by a time duration of one period of the reference clock REFCLK, and for separating the division result into an integer quotient (hereinafter referred to as an integer value) and a residue (hereinafter referred to as odd value or fraction value). The summation processing device 30 sums a delay data $DY_S$ read out from the delay data memory 113C and a fixed value skew SKEW read out from the fixed value storage device 31, and divides the summed result by a time duration of one period of the reference clock REFCLK to obtain an integer value VDAT and an odd value MDAT. The obtained integer value VDAT is supplied to a data input terminal D of the down-counter 11, and the odd value MDAT is supplied to a data input terminal D of the first latch circuit 12.

The odd value MDAT is outputted to the odd delay giving device 20 via the first and second latch circuits 12 and 13 for timing adjustment in synchronism with a timing when the integer delay giving device 10 outputs a delay pulse $P_0$ to the odd delay giving device 20.

The operations of the integer delay giving device 10 and the odd delay giving device 20 will be described in further detail with reference to FIG. 15. Further, as shown in FIG. 14, each of the delay data memory 113C, the down-counter 11, the latch circuit 32, and the first to the third latch circuits 12, 13 and 14 is driven by the reference clock REFCLK shown in FIG. 15A.

A period cycle signal LRAT which is a logical signal shown in FIG. 15B is directly supplied to an enable terminal E of the delay data memory 113C. Therefore, the delay data $DY_{S1}$, $DY_{S2}$, . . . are read out, as shown in FIG. 15D, from the delay data memory 113C in synchronism with the period cycle signal LRAT. FIG. 15C shows the content of the address supplied to an address terminal ADDRESS (ADR) of the delay data memory 113C. In the example of FIG. 15, there is shown a case that the delay data $DY_{S1}$ is set to $DY_{S1}$=30 ns, the delay data $DY_{S2}$ is set to $DY_{S2}$=7.5 ns, the fixed value SKEW is set to SKEW=12 ns.

The summation processing device 30 calculates, in a first test period TS1, 30 ns+12 ns=42 ns, and at the same time, divides the calculated result 42 ns by the period of the reference clock REFCLK (in the illustrated example, 8 ns) to obtain an integer value VDAT=5 (40 ns) and an odd value MDAT=2 (2 ns). The summation processing device 30 calculates, in a second test period TS2, 7.5 ns+12 ns=19.5 ns, and divides the calculated result 19.5 ns by 8 ns to obtain an integer value VDAT=2 (16 ns) and an odd value MDAT= 3.5 (3.5 ns).

The period cycle signal LRAT is also supplied to a data input terminal D of the latch circuit 32. This latch circuit 32 delays, as shown in FIG. 15H, the supplied period cycle signal LRAT to a timing when the next reference clock REFCLK is supplied thereto to supply the delayed period cycle signal LRAT to a load terminal LD of the down-counter 11 and to an enable terminal E of the first latch circuit 12. As a result, the integer value VDAT=5 from the summation processing device 30 is loaded in the down-counter 11 at a timing delayed by an amount of one period of the reference clock REFCLK. In addition, the first latch circuit 12 latches therein, at the same timing as this timing, the odd value MDAT=2 from the summation processing device 30. The integer value VDAT loaded in the down-counter 11 and the odd value latched in the first latch circuit 12 are updated, when a next period cycle signal LRAT is supplied thereto, to an integer value and an odd value of the next test period.

The down-counter 11 down-counts by 1 (decrements the integer value by 1), as shown in FIG. 15I, the loaded integer value VDAT at every, for example, rising timing of the reference clock REFCLK. When the loaded integer value VDAT becomes "0", the down-counter 11 stops the count operation and outputs an integer delay signal MT of logical H shown in upper side of FIG. 15J.

The integer delay signal MT of logical H outputted from the down-counter 11 is supplied to an enable terminal E of the second latch circuit 13 and a data input terminal D of the third latch circuit 14. As a result, the second latch circuit 13 acquires the odd value MDAT=2 latched in the first latch circuit 12 from its data input terminal D and supplies the acquired odd value MDAT to a control input terminal of the odd delay giving device 20 to set the delay time of the odd delay giving device 20 to the odd value=2 (2 ns).

At the same time, the third latch circuit 14 acquires the integer delay signal MT and inputs the integer delay signal MT to one input terminal of the AND gate 15 as a delay pulse MT' of logical H shown in lower side of FIG. 15J. Since an inverted pulse of the reference clock REFCLK inverted by the inverter IN is applied to the other input terminal of the AND gate 15, the AND gate 15 outputs a pulse $P_O$ shown in FIG. 15K during a time when the reference clock REFCLK is logical L. This pulse $P_O$ is inputted to the odd delay giving device 20.

Since the odd delay giving device 20 has the amount of delay 2 ns already set therein by the output signal MDAT of the second latch circuit 13, the odd delay giving device 20 outputs a set pulse $P_{S1}$ which is further delayed by 2 ns from the pulse $P_O$. Since, in the next test period TS2, the odd value MDAT is 3.5 ns, the amount of delay of the odd delay giving device 20 is set to 3.5 ns. Therefore, in the next test period TS2, the odd delay giving device 20 outputs a set pulse $P_{S2}$ which is further delayed by 3.5 ns from the pulse $P_O$.

In such away, a set pulse $P_S$ is generated by the clock generator 113A constructed as mentioned above, and a reset pulse $P_R$ is generated by the other clock generator 113B. It could be easily understood that the waveform formatter 114 is driven by the set pulse $P_S$ and the reset pulse $P_R$ to generate a test pattern signal TP.

In the aforementioned description of the operation, it is assumed that each of the delay data $DY_S$ and $DY_R$ read out from the delay data memory 113C and inputted to the summation processing device 30 has a proper value. However, in practice, the delay data stored in the delay data memory 113C is a delay data which is read into the main controller 111 shown in FIG. 11 and transferred therefrom to the delay data memory 113C. Namely, the delay data stored in the delay data memory 113C is, tracing back to the origin, the delay data that has been written by the user in the test program PM. Therefore, there is possibly a case that the user has described an erroneous (improper) set value in the test program.

For example, like a set state that a time duration from a generation timing of a set pulse $P_S$ to a generation timing of a reset pulse $P_R$ (set-reset time duration or time width) is too short in one test period or a set state that a time duration from a generation timing of a reset pulse $P_R$ to a generation timing of a next set pulse $P_S$ (reset-set time duration or time width) is too short, or the like, in the case that the user has erroneously described those time durations, the IC tester may not normally operate. In such a case that a test is performed in the state of a set error, there occurs an erroneous operation that a normal IC is determined to be a failure IC. For this reason, in the IC tester using the conventional timing generating apparatus, there is a serious drawback that a failure occurring rate becomes high and an analysis of the cause takes a long time.

SUMMARY OF THE INVENTION

It is a first object of the present invention to provide a timing signal generating apparatus which is capable of immediately detecting any erroneous set state relative to a timing signal existing in a program.

It is a second object of the present invention to provide a semiconductor device testing apparatus provided with a set error detecting means that can immediately detect any description error relative to a timing signal existing in a program.

It is a third object of the present invention to provide a method of detecting any set error to a timing signal, which can immediately detect any erroneous set state relative to a timing signal existing in a program.

In order to accomplish the above objects, in a first aspect of the present invention, there is provided a timing signal generating apparatus for generating a set pulse and a reset pulse with a predetermined delay time between them on the basis of a program, and producing a logical signal having a predetermined level using these set pulse and reset pulse, and comprises: a first set error detecting means for detecting a time duration from a timing at which the set pulse is generated until a timing at which the reset pulse is generated, and informing of a set error if the detected time duration is shorter than a predetermined limit value.

In a preferred embodiment, the first set error detecting means detects a time duration from a timing at which the set pulse is generated until a timing at which the reset pulse is generated within the same one period of a reference clock, and generates a logical signal representing the set error if the detected time duration is shorter than a first predetermined limit value.

In addition, the first set error detecting means detects a time duration from a timing at which the set pulse is generated until a timing at which the reset pulse is generated within adjacent periods of the reference clock, and generates a logical signal representing the set error if the detected time duration is shorter than a second predetermined limit value.

The first set error detecting means comprises: same cycle decision means for detecting a time duration from a timing at which the set pulse is generated until a timing at which the reset pulse is generated within the same one period of a reference clock, and determining whether the detected time duration is shorter than a first predetermined limit value or not; different cycle decision means for detecting a time duration from a timing at which the set pulse is generated until a timing at which the reset pulse is generated within adjacent periods of the reference clock, and determining whether the detected time duration is shorter than a second predetermined limit value or not; and means for generating a logical signal representing the set error if the detected time duration by said same cycle decision means is shorter than the first predetermined limit value or if the detected time duration by said different cycle decision means is shorter than the second predetermined limit value.

In a second aspect of the present invention, there is provided a timing signal generating apparatus for generating a set pulse and a reset pulse with a predetermined delay time between them on the basis of a program, and producing a logical signal having a predetermined level using these set pulse and reset pulse, and comprises: a second set error detecting means for detecting a time duration from a timing at which the reset pulse is generated until a timing at which the set pulse is generated, and informing of a set error if the detected time duration is shorter than a predetermined limit value.

In a preferred embodiment, the second set error detecting means detects a time duration from a timing at which the reset pulse is generated until a timing at which the set pulse is generated within the same one period of a reference clock, and generates a logical signal representing the set error if the detected time duration is shorter than a first predetermined limit value.

In addition, the second set error detecting means detects a time duration from a timing at which the reset pulse is generated until a timing at which the set pulse is generated within adjacent periods of a reference clock, and generates a logical signal representing the set error if the detected time duration is shorter than a second predetermined limit value.

The second set error detecting means comprises: same cycle decision means for detecting a time duration from a timing at which the reset pulse is generated until a timing at which the set pulse is generated within the same one period of a reference clock, and determining whether the detected time duration is shorter than a first predetermined limit value or not; different cycle decision means for detecting a time duration from a timing at which the reset pulse is generated until a timing at which the set pulse is generated within adjacent periods of the reference clock, and determining whether the detected time duration is shorter than a second predetermined limit value or not; and means for generating a logical signal representing the set error if the detected time duration by said same cycle decision means is shorter than the first predetermined limit value or if the detected time duration by said different cycle decision means is shorter than the second predetermined limit value.

In a third aspect of the present invention, there is provided a timing signal generating apparatus further includes: the above-mentioned second set error detecting means for detecting a time duration from a timing at which the reset pulse is generated until a timing at which the set pulse is generated, and informing of a set error if the detected time duration is shorter than a predetermined limit value.

In a fourth aspect of the present invention, there is provided a semiconductor device testing apparatus in which a set pulse and a reset pulse are generated with a predetermined delay time between them from a timing signal generator on the basis of a program, a test pattern signal having a predetermined level is produced using these set pulse and reset pulse, and the test pattern signal is applied to a semiconductor device under test, and comprises: a first set error detecting means for detecting a time duration from a timing at which the set pulse is generated until a timing at which the reset pulse is generated, and informing of a set error if the detected time duration is shorter than a predetermined limit value.

In a fifth aspect of the present invention, there is provided a semiconductor device testing apparatus in which a set pulse and a reset pulse are generated with a predetermined delay time between them from a timing signal generator on the basis of a program, a test pattern signal having a predetermined level is produced using these set pulse and reset pulse, and the test pattern signal is applied to a semiconductor device under test, and comprises: a second set error detecting means for detecting a time duration from a timing at which the reset pulse is generated until a timing at which the set pulse is generated, and informing of a set error if the detected time duration is shorter than a predetermined limit value.

In a sixth aspect of the present invention, there is provided a semiconductor device testing apparatus further includes; the above-mentioned second set error detecting means for detecting a time duration from a timing at which the reset pulse is generated until a timing at which the set pulse is generated, and informing of a set error if the detected time duration is shorter than a predetermined limit value.

In a seventh aspect of the present invention, there is provided a method of detecting any set error to a timing signal comprising the steps of: generating a set pulse and a reset pulse at predetermined timings on the basis of a program; producing a logical signal having a predetermined level using these set pulse and reset pulse; detecting a time duration from a timing at which the set pulse is generated until a timing at which the reset pulse is generated; and informing of a set error if the detected time duration is shorter than a predetermined limit value.

The time duration detecting step includes a step of detecting a time duration from the timing at which the set pulse is generated until the timing at which the reset pulse is generated within the same one period of a reference clock, and said set error informing step includes the steps of: determining whether the detected time duration is shorter than a first predetermined limit value or not; and generating a logical signal representing the set error if the detected time duration is shorter than the first predetermined limit value.

In addition, the time duration detecting step includes a step of detecting a time duration from the timing at which the set pulse is generated until the timing at which the reset pulse is generated within adjacent periods of a reference clock, and said set error informing step includes the steps of: determining whether the detected time duration is shorter than a second predetermined limit value or not; and generating a logical signal representing the set error if the detected time duration is shorter than the second predetermined limit value.

In an eighth aspect of the present invention, there is provided a method of detecting any set error to a timing signal, which comprises the steps of: generating a set pulse and a reset pulse at predetermined timings on the basis of a program; producing a logical signal having a predetermined level using these set pulse and reset pulse; detecting a time duration from a timing at which the reset pulse is generated until a timing at which the set pulse is generated; and informing of a set error if the detected time duration is shorter than a predetermined limit value.

The time duration detecting step includes a step of detecting a time duration from the timing at which the reset pulse is generated until the timing at which the set pulse is generated within the same one period of a reference clock, and said set error informing step includes the steps of: determining whether the detected time duration is shorter than a first predetermined limit value or not; and generating a logical signal representing the set error if the detected time duration is shorter than the first predetermined limit value.

In addition, the time duration detecting step includes a step of detecting a time duration from the timing at which the reset pulse is generated until the timing at which the set pulse is generated within adjacent periods of a reference clock, and said set error informing step includes the steps of: determining whether the detected time duration is shorter than a second predetermined limit value or not; and generating a logical signal representing the set error if the detected time duration is shorter than the second predetermined limit value.

In a ninth aspect of the present invention, there is provided a method of detecting any set error to a timing signal, which comprises the steps of: generating a set pulse and a reset pulse at predetermined timings on the basis of a program; producing a logical signal having a predetermined level using these set pulse and reset pulse; detecting a pulse duration of said logical signal from a timing at which the set pulse is generated until a timing at which the reset pulse is generated; informing of a first set error if the detected pulse duration is shorter than a predetermined limit value; detecting a time duration from a timing at which the reset pulse is generated until a timing at which the set pulse is generated; and informing of a second set error if the detected time duration is shorter than a second predetermined limit value.

The pulse duration detecting step includes the steps of: detecting a pulse duration from the timing at which the set pulse is generated until the timing at which the reset pulse is generated within the same one period of a reference clock; and detecting a pulse duration from the timing at which the set pulse is generated until the timing at which the reset pulse is generated within adjacent periods of the reference clock. The time duration detecting step includes the steps of: detecting a time duration from the timing at which the reset pulse is generated until the timing at which the set pulse is generated within the same one period of the reference clock; and detecting a time duration from the timing at which the reset pulse is generated until the timing at which the set pulse is generated within adjacent periods of the reference clock. The first set error informing step includes the steps of: determining whether or not the detected pulse duration is shorter than a first predetermined limit value or a second predetermined limit value; and generating a logical signal representing the first set error if the detected pulse duration is shorter than the first predetermined limit value or the second predetermined limit value. The second set error informing step includes the steps of: determining whether or not the detected time duration is shorter than a first predetermined limit value or a second predetermined limit value; and generating a logical signal representing the second set error if the detected time duration is shorter than the first predetermined limit value or the second predetermined limit value.

According to the present invention, even if any set error is described in a program regarding a timing signal, such set error can immediately be detected by executing this program once. Therefore, since the cause of a high failure occurrence rate or the like can be analyzed or made clear in a shot time period, there is obtained an advantage that the efficiency of the test can be increased in the case that the present invention is applied to, for example, an IC tester for testing an IC.

BRIEF DESCRIPTION OF THE DRAWINGS

FIGS. 2A–2P are timing charts for explaining the operation of the clock generator shown in FIG. 1;

FIG. 3 is a block diagram showing a first set error detecting apparatus used in an embodiment of the timing signal generating apparatus according to the present invention;

FIGS. 4A–4G are timing charts for explaining the operation of the first set error detecting apparatus shown in FIG. 3;

FIGS. 5A–5D are also timing charts for explaining the operation of the first set error detecting apparatus shown in FIG. 3;

FIGS. 6A–6D are also timing charts for explaining the operation of the first set error detecting apparatus shown in FIG. 3;

FIGS. 8A–8D are timing charts for explaining the operation of the second set error detecting apparatus shown in FIG. 7;

FIGS. 9A–9D are timing charts for explaining the operation of the second set error detecting apparatus shown in FIG. 7;

FIG. 10 is a block diagram showing an entire configuration of the combined apparatus of the first set error detecting apparatus shown in FIG. 3 and the second set error detecting apparatus shown in FIG. 7;

FIG. 12 is a block diagram showing configurations of a timing generator and a waveform formatter used in the semiconductor device testing apparatus shown in FIG. 11;

FIGS. 13A–13D are timing charts for explaining the operations of the timing generate and the waveform formatter shown in FIG. 12;

FIGS. 15A–15N are timing charts for explaining the operation of the clock generator shown in FIG. 14.

DETAILED DESCRIPTION OF THE PREFERRED EMBODIMENTS

Figure 1:
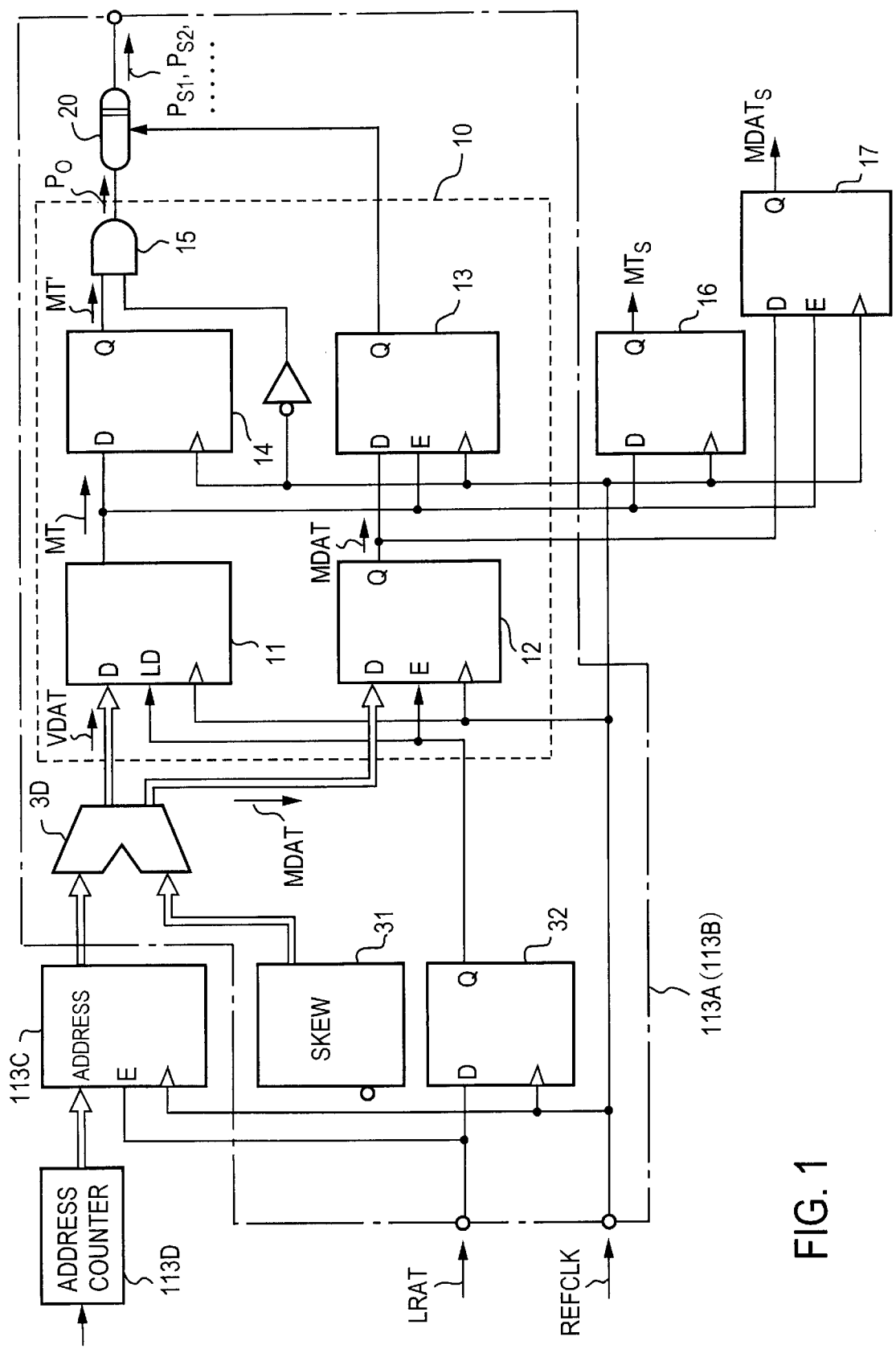
FIG. 1 is a block diagram showing a clock generator used in an embodiment of the timing signal generating apparatus according to the present invention.

Now, the present invention will be described with respect to the preferred embodiments thereof in detail with reference to FIGS. 1 to 10. Further, portions, waveforms and elements in those drawings corresponding to those in FIGS. 11 to 15 are shown by the same reference characters affixed thereto, and the explanation thereof will be omitted unless it is necessary.

FIG. 1 is a block diagram showing a clock generator and its related circuits used in an embodiment of the timing signal generating apparatus according to the present invention. This embodiment shows a case that the timing signal generating apparatus is used in an IC tester. Further, FIG. 1 shows in detail only an internal configuration of the clock generator 113A for generating a set pulse $P_S$. Since an internal configuration of the clock generator 113B for generating a reset pulse $P_R$ has similar configuration to the internal configuration of the clock generator 113A, it will not be shown. Hereinafter, the configuration and the operation of the clock generator 113A for generating a set pulse $P_S$ will mainly be described.

Figure 14:
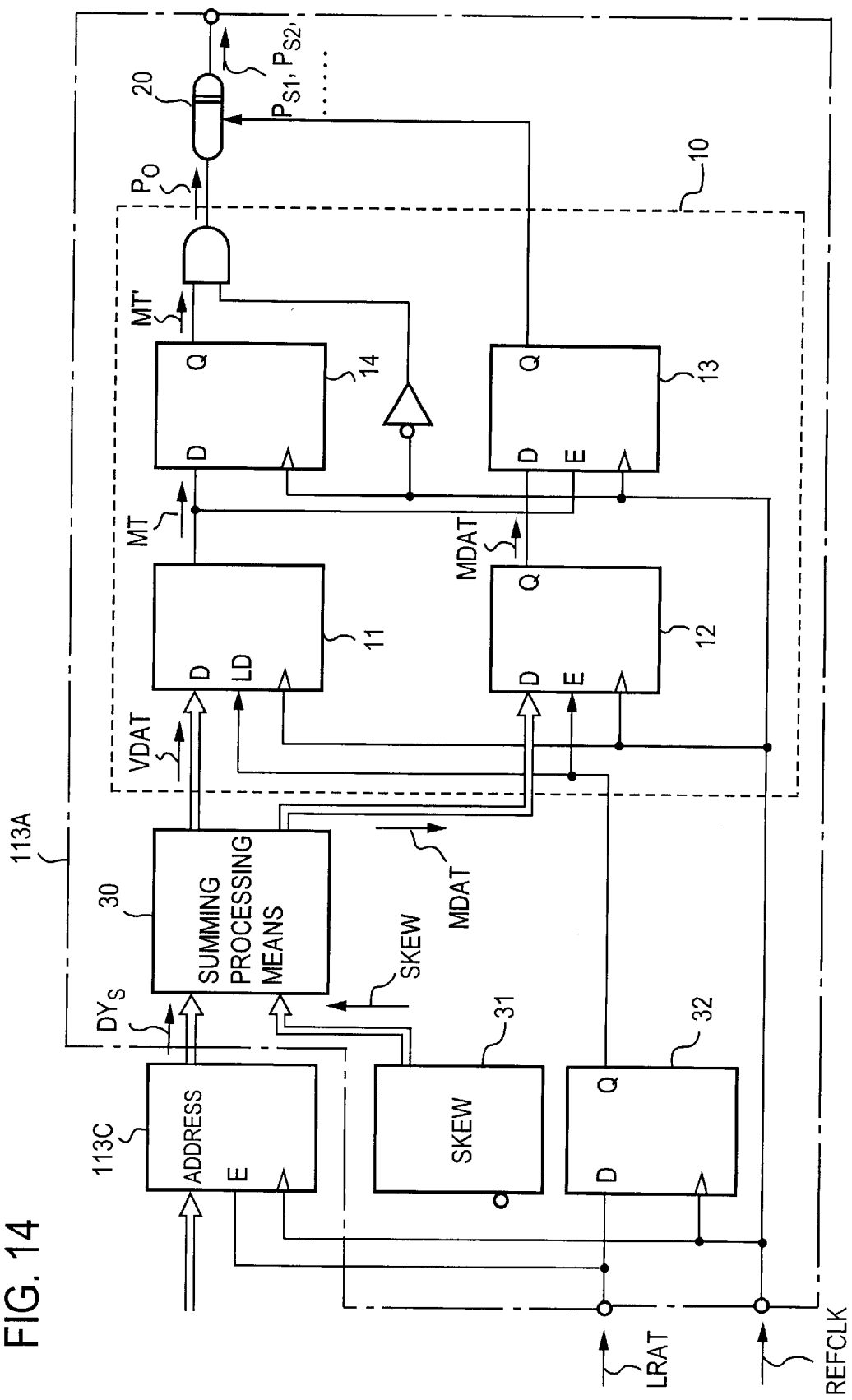
FIG. 14 is a block diagram showing a detailed configuration of the clock generator used in the timing generator shown in FIG. 12.

Since the configuration of the clock generator 113A is the same as that of the prior art clock generator shown in FIG. 14, the detailed explanation thereof will be omitted. The clock generator 113A comprises an integer delay giving device 10 for providing a delay time of an integer multiplied by one period of the reference clock REFCLK shown in FIG. 2A, the one period of the reference clock being used as a unit delay time, an odd delay giving apparatus 20 provided at the output side of the integer delay giving device 10, and a summation processing device 30 provided at the input side of the integer delay giving device 10, a fixed value storage device 31 provided at the input side of the integer delay giving device 10, and a latch circuit 32 provided at the input side of the integer delay giving device 10. The odd delay giving apparatus 20 provides a delay time smaller than one period of the reference clock REFCLK.

In the present invention, the configuration is characterized in that at the outside of the clock generator 113A are provided a fourth latch circuit 16 for latching therein an integer delay signal MT outputted from the down-counter 11 of the integer delay giving device 10, and a fifth latch circuit 17 for latching therein an odd value (a residue which cannot be divided by one period) MDAT outputted from the first latch circuit 12 of the integer delay giving device 10.

The fourth and fifth latch circuits 16 and 17 are driven by the reference clock REFCLK, and the integer delay signal MT outputted from the down-counter 11 is inputted, at the same time, to a data input terminal D of the fourth latch circuit 16 and an enable terminal E of the fifth latch circuit 17. In addition, the odd value MDAT outputted from the first latch circuit 12 is also supplied to a data input terminal D of the fifth latch circuit 17. As a result, when the down-counter 11 outputs the integer delay signal MT, the fourth latch circuit 16 acquires the integer delay signal MT, and at the same time, the fifth latch circuit 17 acquires the odd value MDAT outputted from the first latch circuit 12.

Since the other configuration is quite same as that of the prior art example shown in FIG. 14, the only operations of the fourth and fifth latch circuits 16 and 17 will be described here.

The fourth latch circuit 16 latches therein the acquired integer delay signal MT and outputs the integer delay signal MT in synchronism with the next reference clock REFCLK. Therefore, the fourth latch circuit 16 delays, as shown in FIG. 20, the acquired integer delay signal MT by 1 reference clock period to output the integer delay signal MT. The fifth latch circuit 17 similarly latches therein the acquired odd value MDAT and outputs, as shown in FIG. 2P, the odd value $MDAT_S$ delayed by 1 reference clock period in synchronism with the next reference clock REFCLK.

FIG. 3 shows a configuration of a first set error detecting apparatus used in an embodiment of the timing signal generating apparatus according to the present invention. This first set error detecting apparatus 200 comprises a same cycle decision apparatus 210, a different cycle decision apparatus 220, first and second S-R flip-flops SR1 and SR2, first and second AND gates AND1 and AND2, and an OR gate OR for performing a logical OR operation of a test start signal TES and a data bus reset signal DBRES.

The same cycle decision apparatus 210 measures, when a set pulse $P_S$ and a reset pulse $P_R$ are generated in the same cycle of the reference clock REFCLK, a time difference between a generation timing of the set pulse $P_S$ and a generation timing of the reset pulse $P_R$, namely a pulse duration or pulse width within the same cycle, to determine whether or not the pulse duration is equal to or greater than a limitation value, or equal to or less than a limitation value. On the other hand, the different cycle decision apparatus 220 measures, when a generation timing of the set pulse $P_S$ is in a different cycle (adjacent cycle) from the cycle of a generation timing of the reset pulse $P_R$, a time difference between those timings, namely a pulse duration or pulse width, to determine whether or not the pulse duration is equal to or greater than a limitation value, or equal to or less than a limitation value.

There are provided a first latch circuit group DF1 for latching therein an integer delay pulse $MT_S$ and an odd value $MDAT_S$ respectively outputted from the fourth and the fifth latch circuits 16 and 17 provided at outside of the clock generator 113A for set pulse generation shown in FIG. 1 and an integer delay pulse $MT_R$ and an odd value $MDAT_R$ respectively outputted from the fourth and the fifth latch circuits provided at outside of the clock generator 113B for reset pulse generation not shown in FIG. 1, and a second latch circuit group DF2 for latching therein an integer delay pulse $MT_{S1}$, an odd value $MDAT_{S1}$, an integer delay pulse $MT_{R1}$ and an odd value $MDAT_{R1}$, respectively.

Those first and second latch circuit groups DF1 and DF2 are connected in cascade, and all the latch circuits are driven by the reference clock REFCLK. Therefore, each of the data transmitted through those latch circuit groups DF1 and DF2 is delayed by an amount of one period of the reference clock REFCLK between the input side and output side of the first latch circuit group DF1, and an amount of one period of the reference clock REFCLK between the input side and output side of the second latch circuit group DF2.

FIG. 4 is a timing chart for explaining the operation of the first set error detecting apparatus 200 shown in FIG. 3 and shows timings of the data $MT_S$, $MDAT_S$, $MT_R$ and $MDAT_R$ at the input side of the first latch circuit group DF1, the data $MT_{S1}$, $MDAT_{S1}$, $MT_{R1}$, and $MDAT_{R1}$ at the output side of the first latch circuit group DF1 (input side of the second latch circuit group DF2), and the data $MT_{S2}$, $MDAT_{S2}$, $MT_{R2}$ and $MDAT_{R2}$ at the output side of the second latch circuit group DF2.

The same cycle decision apparatus 210 detects a state shown as "CASE1" in FIGS. 4D and 4E. Therefore, the same cycle decision apparatus 210 comprises a NAND gate NAND1 for performing a NAND (AND with negated output) operation of the data $MT_{S1}$ and $MT_{R1}$ outputted from the first latch circuit group DF1, a subtracter SUB1 for performing a subtraction between the data $MDAT_{S1}$ and $MDAT_{R1}$ outputted from the first latch circuit group DF1 (in this example, $MDAT_{S1}$ is subtracted from $MDAT_{R1}$), a comparator MC1 for comparing the subtracted result outputted from the subtracter SUB1 with a pulse duration limitation value $WMT_1$ supplied from a limitation value storage LMT provided at outside of the first set error detecting apparatus 200, a latch circuit DF4 for latching therein the comparison result output of the comparator MC1, and a NAND gate NAND1A whose both input terminals are inverting terminals for inhibiting a borrow signal outputted at a borrow terminal BR of the subtracter SUB1 from being inputted to an enable terminal E of the comparator MC1.

That is, the NAND gate NAND1 detects that the integer delay signals of set side and reset side $MT_{S1}$ and $MT_{R1}$ are generated at the same timing, and detects that a set pulse $P_S$ and a reset pulse $P_R$ are generated, as shown in FIGS. 5A, 5B and 5C, in the same period of the reference clock REFCLK.

Simultaneously with this detection, The subtracter SUB1 acquires the odd value $MDAT_{S1}$ of the set side and the odd value $MDAT_{R1}$ of the reset side in its input terminals A and B, respectively to calculate B-A ($MDAT_{R1}$-$MDAT_{S1}$), and obtains a pulse duration $T_{PW}$ of the test pattern signal TP shown in FIG. 5D. The obtained pulse duration $T_{PW}$ is inputted to an input terminal A of the comparator MC1. A limitation value $WMT_1$ of the pulse duration is inputted from the limitation value storage LMT to the other input terminal B of the comparator MC1 to determine which one of the data is larger.

If the pulse duration $T_{PW}$ inputted to the input terminal A of the comparator MC1 is smaller than the limitation value $WMT_1$, the comparator MC1 outputs a logical H signal indicating a set error. Namely, in the case of $T_{PW}<WMT_1$, it is meant that the pulse duration $T_{PW}$ set in the program PM is narrower than the limitation value $WMT_1$. This logical H signal is supplied to a set terminal S of the first S-R flip-flop SR1 after being latched in the latch circuit DF4. By this operation, a logical H signal is outputted from the first S-R flip-flop SR1, and is supplied to an input terminal of the first AND gate AND1. A read command RECOM is supplied to the other input terminal of the first AND gate AND1. An set error detection signal (error signal) of logical H is outputted, in synchronism with the read command RECOM, from the AND gate AND1 to an output terminal ERR. Further, the first S-R flip-flop SR1 is reset when a reset signal such as a test start signal TES to be supplied thereto at the test start time and/or a data bus reset signal DBRES to be supplied thereto at the data bus reset time is supplied to its reset terminal R via an OR gate OR.

On the contrary, in the case of $T_{PW}$>$WMT_1$ in the comparator MC1, a logical L signal indicating no set error is outputted. Even if this logical L signal is supplied to the set terminal S of the first S-R flip-flop SR1, the S-R flip-flop SR1 does not output a logical H signal. Therefore, a set error detection signal is not outputted to the output terminal ERR.

The different cycle decision apparatus 220 detects a state shown as "CASE2" in FIGS. 4E and 4F. For this reason, the different cycle decision apparatus 220 comprises a NAND gate NAND2 for performing a NAND (AND with negated output) operation of the data $MT_{S2}$ outputted from the second latch circuit group DF2 and the data $MTR_1$ outputted from the first latch circuit group DF1, a subtracter SUB2 for performing a subtraction between the data $MDAT_{S2}$ outputted from the second latch circuit group DF2 and the data $MDAT_{R1}$ outputted from the first latch circuit group DF1 (in this example, $MDAT_{S2}$ is subtracted from $MDAT_{R1}$), a comparator MC2 for comparing the subtracted result outputted from the subtracter SUB2 with a pulse duration limitation value $WMT_1$ supplied from a limitation value storage LMT, and a latch circuit DF5 for latching therein the comparison result output of the comparator MC2.

The NAND gate NAND2 detects that the integer delay signals of set side and reset side $MT_{S2}$ and $MT_{R1}$ are generated at the different timings, and detects that, as shown in FIGS. 6A, 6B and 6C, a set pulse $P_S$ is generated in a period $T_1$ of the reference clock REFCLK and a reset pulse $P_R$ is generated in the next period $T_2$ of the reference clock REFCLK.

In order to achieve this, it is necessary for the NAND gate NAND2 to detect that an integer delay signal $MT_{S2}$ of the set side is outputted at the output side of the second latch circuit group DF2, and that an integer delay signal MTR1 of the reset side is outputted at the output side of the first latch circuit group DF1. At the same time, it is necessary that a subtraction between the odd value $MDAT_{S2}$ of the set side and the odd value $MDAT_{R1}$ of the reset side is performed by the subtracter SUB2 (in this example, the odd value $MDAT_{S2}$ is subtracted from the odd value $MDAT_{R1}$) to calculate a time difference from the generation timing of the set pulse $P_S$ to the generation timing of the reset pulse $P_R$, i.e., the pulse duration $T_{PW}$. In this case, as can be understood from FIGS. 6A, 6B and 6C, if one period of the reference clock REFCLK is assumed to be 8 ns, and $MDAT_{S2}$=3 ns, $MDAT_{R1}$=4 ns are assumed, the subtraction by the subtracter SUB2 is 8+4−3=9 ns. As a result, the pulse duration 9 ns of the test pattern signal TP shown in FIG. 6D is calculated.

That is, the sum of the odd value $MDAT_{R1}$=4 ns and a value of one clock $T_{REF}$=8 ns of the reference clock REFCLK, i.e., 12 ns is inputted to the input terminal B of the subtracter SUB2 shown in FIG. 3, and the odd value $MDAT_{S2}$=3 ns inputted to the input terminal A of the subtracter SUB2 is subtracted from the summed value (12−3=9 ns) to obtain the pulse duration $T_{PW}$=9 ns of the output waveform.

The calculated pulse duration $T_{PW}$ is inputted to an input terminal A of the comparator MC2. A limitation value $WMT_1$ of the pulse duration is inputted to the other input terminal B of the comparator MC2 to determine which one of the data is larger. In the case of $T_{PW}$>$WMT_1$, a logical L signal indicating no set error is outputted from the comparator MC2. Even if this logical L signal is supplied to a set terminal S of the S-R flip-flop SR2, the S-R flip-flop SR2 does not output a logical H signal. Therefore, a set error (error) detection signal is not outputted to the ERR terminal.

In the case of $T_{PW}$<$WMT_1$, the comparator MC2 outputs a logical H signal indicating a set error. Namely, it is meant that the pulse duration $T_{PW}$ set in the test program PM is narrower than the limitation value $WMT_1$. This logical H signal is supplied to a set terminal S of the second S-R flip-flop SR2 after being latched in the latch circuit DF5. By this operation, a logical H signal is outputted from the second S-R flip-flop SR2, and is supplied to an input terminal of the second AND gate AND2. A read command RECOM is supplied to the other input terminal of the second AND gate AND2. An set error detection signal (error signal) of logical H is outputted, in synchronism with the read command RECOM, from the AND gate AND2 to the output terminal ERR. Further, the second S-R flip-flop SR2 is reset, similarly to the first S-R flip-flopSR1, when a reset signal such as a test start signal TES to be supplied thereto at the test start time and/or a data bus reset signal DBRES to be supplied thereto at the data bus reset time is supplied to its reset terminal R via an OR gate OR.

Figure 7:
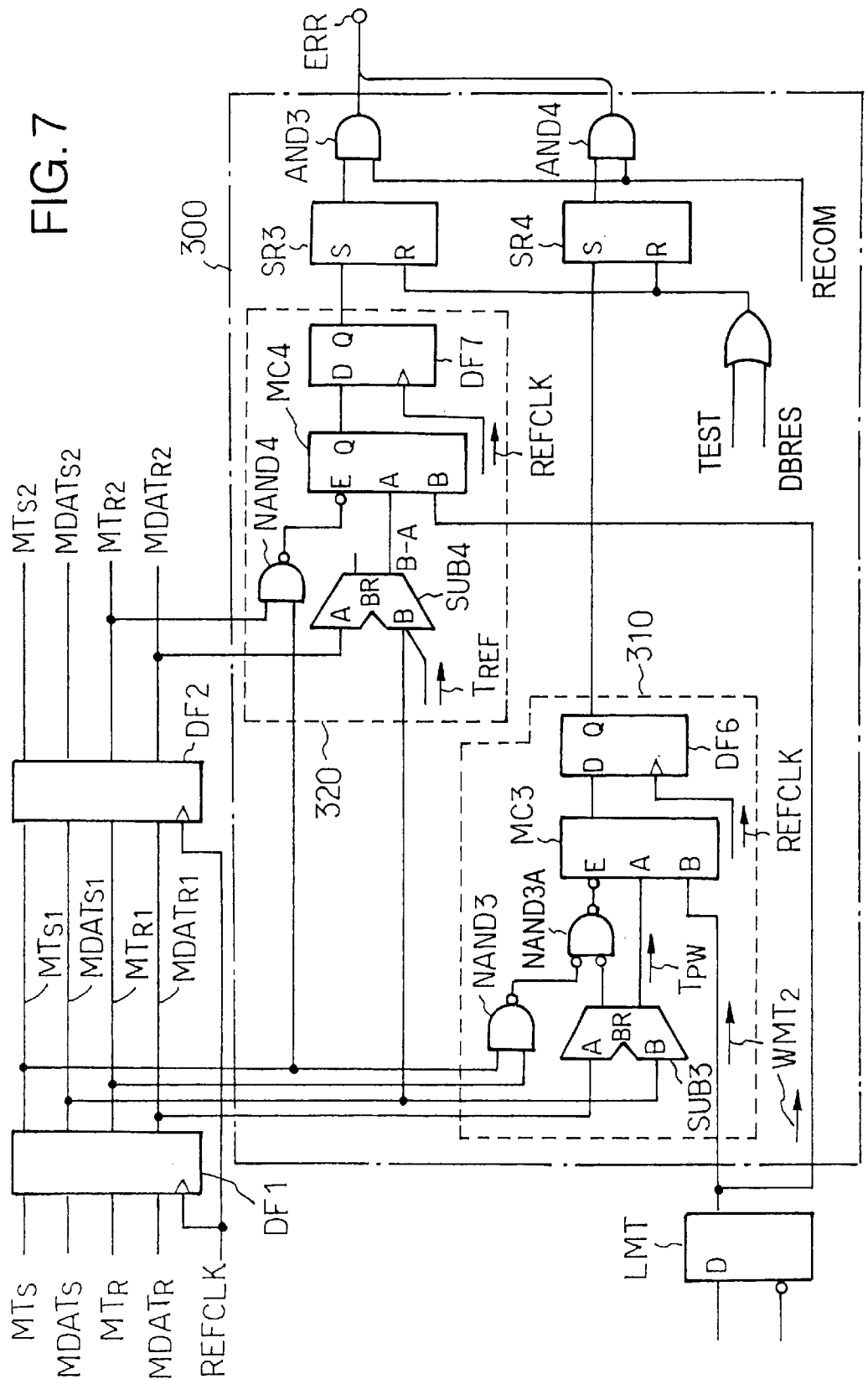
FIG. 7 is a block diagram showing a second set error detecting apparatus used in an embodiment of the timing signal generating apparatus according to the present invention.
Figure 11:
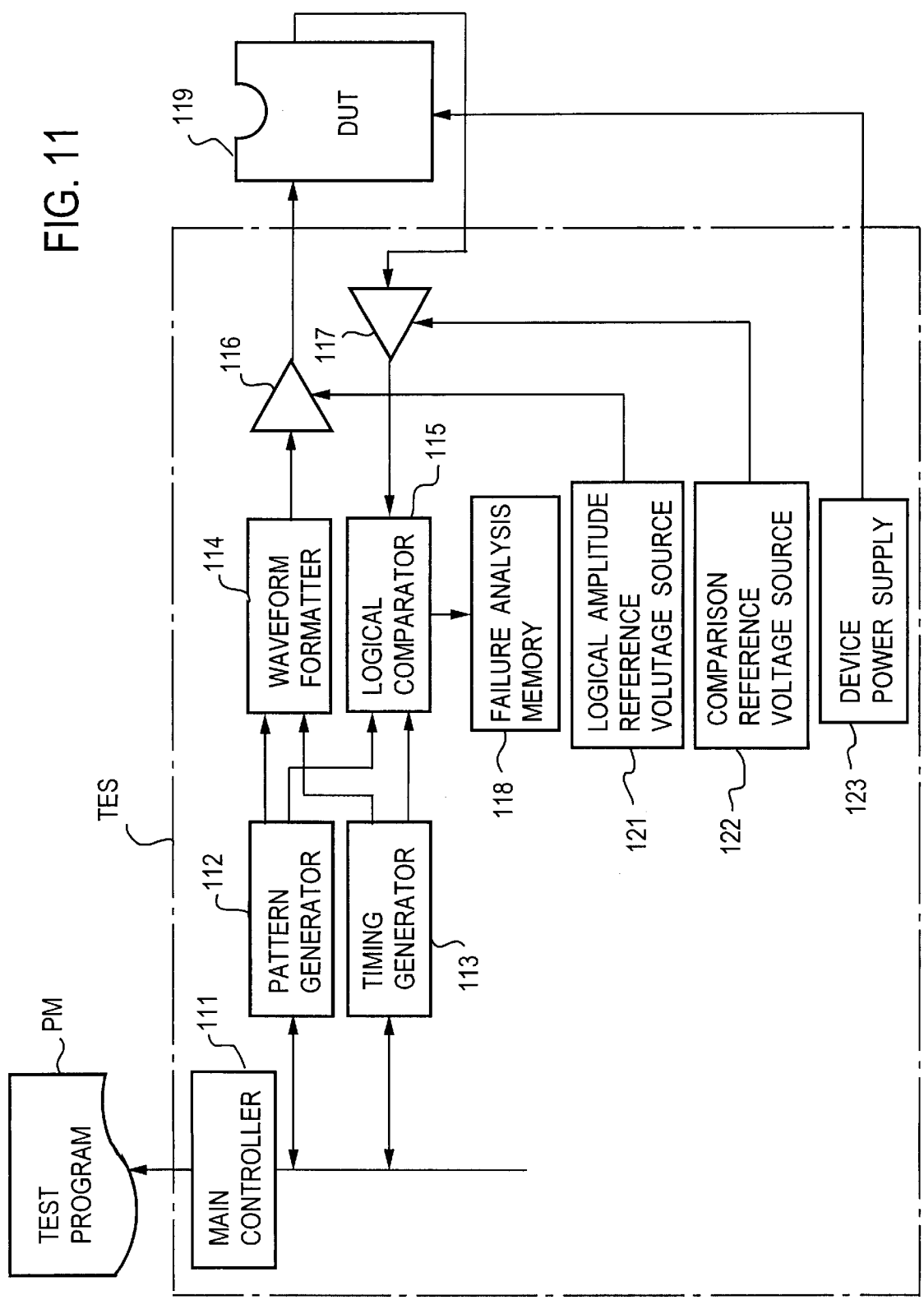
FIG. 11 is a block diagram showing a general construction of an example of the conventional semiconductor device testing apparatus.

FIG. 7 is a block diagram showing a second set error detecting apparatus used in an embodiment of the timing signal generating apparatus according to the present invention. This second set error detecting apparatus 300 detects whether or not a time interval from a falling edge of a previous test pattern signal TP (generation timing of a reset pulse) to a rising edge of a next test pattern signal TP (generation timing of a set pulse) in the same cycle of the reference clock REFCLK is smaller than a limitation value $WMT_2$. Namely, the second set error detecting apparatus detects whether or not a time interval from a falling edge of a test pattern signal TP outputted in a immediate previous reference clock period or a further previous reference clock period to a rising edge of a test pattern signal TP outputted next (reset-set time duration) is smaller than a limitation value $WMT_2$.

This second set error detecting apparatus 300 comprises a same cycle decision apparatus 310, a different cycle decision apparatus 320, third and fourth S-R flip-flops SR3 and SR4, third and fourth AND gates AND3 and AND4, and an OR gate OR for performing a logical OR operation of a test start signal TES and a data bus reset signal DBRES.

The same cycle decision apparatus 310 detects that a reset pulse $P_R$ and a set pulse $P_S$ are generated in the sequence of the reset pulse→ the set pulse in the same cycle of the reference clock REFCLK, and measures a time difference between a generation timing of the reset pulse $P_R$ and a generation timing of the set pulse $P_S$, namely a reset-set time duration within the same cycle, to determine whether or not the time duration is equal to or greater than a limitation value, or equal to or less than a limitation value.

The same cycle decision apparatus 310 detects a state shown as "CASE3" in FIGS. 4D and 4E. Therefore, the same cycle decision apparatus 310 comprises a NAND gate NAND3 for performing a NAND (AND with negated output) operation of the data $MT_{S1}$ and $MT_{R1}$ outputted from the first latch circuit group DF1, a subtracter SUB3 for performing a subtraction (B-A) between the data $MDAT_{S1}$ and $MDAT_{R1}$ outputted from the first latch circuit group DF1 (in this example, $MDAT_{S1}$ is subtracted from $MDAT_{R1}$), a comparator MC3 for comparing the subtracted result outputted from the subtracter SUB3 with a pulse duration limitation value $WMT_2$ supplied from a limitation value storage LMT provided at outside of the second set error detecting apparatus 300, a latch circuit DF6 for latching therein the comparison result output of the comparator MC3, and a NAND gate NAND3A whose both input terminals are inverting terminals for inhibiting a borrow signal outputted at a borrow terminal BR of the subtracter SUB3 from being inputted to an enable terminal E of the comparator MC3.

That is, the NAND gate NAND3 detects that the integer delay signals of set side and reset side $MT_{S1}$ and $MT_{R1}$ are generated at the same timing, and detects that a reset pulse $P_R$ and a set pulse $P_S$ are generated, as shown in FIGS. 8A, 8B and 8C, in the same period ($T_1$) of the reference clock REFCLK.

Simultaneously with this detection, the subtracter SUB3 acquires the odd value $MDAT_{S1}$ of the set side and the odd value $MDAT_{R1}$ of the reset side in its input terminals A and B, respectively to calculate the difference B-A between those data ($MDAT_{R1}-MDAT_{S1}$), and obtains a pulse duration $T_{PW}$ of the test pattern signal TP shown in FIG. 8D. The obtained pulse duration $T_{PW}$ is inputted to an input terminal A of the comparator MC3. A limitation value $WMT_2$ of the pulse duration is inputted from the limitation value storage LMT to the other input terminal B of the comparator MC3 to determine which one of the data is larger.

If the time duration TRS inputted to the input terminal A of the comparator MC3 is smaller than the limitation value $WMT_2$ ($T_{RS}<WMT_2$), the comparator MC3 outputs a logical H signal indicating a set error. This logical H signal is supplied to a set terminal S of the fourth S-R flip-flop SR4 after being latched in the latch circuit DF6. By this operation, a logical H signal is outputted from the fourth S-R flip-flop SR4, and is supplied to an input terminal of the fourth AND gate AND4. A read command RECOM is supplied to the other input terminal of the fourth AND gate AND4. An set error detection signal (error detection signal) of logical H is outputted, in synchronism with the read command RECOM, from the AND gate AND4 to an output terminal ERR. Further, the fourth S-R flip-flop SR4 is reset when a reset signal such as a test start signal TES to be supplied thereto at the test start time and/or a data bus reset signal DBRES to be supplied thereto at the data bus reset time is supplied to its reset terminal R via an OR gate OR.

In the example of CASE3 shown in FIG. 4, since the fraction $MDAT_{S1}$ is $MDAT_{S1}=6$ ns and the fraction $MDAT_{R1}$ is $MDAT_{R1}=1$ ns in the case that the $MT_{S1}$ and $MT_{R1}$ are present at the same timing, as shown in FIG. 8B, a set pulse $P_S$ is outputted after 6 ns from the rising edge of the first period of reference clock REFCLK. In the case that the test pattern signal TP is outputted before the set pulse $P_S$, and the falling timing of this output waveform is the timing after 1 ns from the rising edge of the first period $T_1$ of the reference clock REFCLK, the time duration $T_{RS}$ from the falling timing of the previous test pattern signal TP to the rising timing of the next test pattern signal TP is 6−1=5 ns.

This $T_{RS}=5$ ns and the limitation value $WMT_2$ outputted from the limitation value storage LMT are inputted to the comparator MC3. If $T_{RS}<WMT_2$, it is determined that the set value is too small. Hence, it is judged that a set error is performed, and an error detection signal of logical H is outputted to the output terminal ERR.

On the contrary, the different cycle decision apparatus 320 measures, when a reset pulse $P_R$ and a set pulse $P_S$ are generated in the sequence of the reset pulse→ the set pulse in the different cycles of the reference clock REFCLK respectively, a time difference between a generation timing of the reset pulse $P_R$ and a generation timing of the set pulse $P_S$, i.e., a reset-set time duration ranging different cycles of the reference clock REFCLK to determine whether or not the time duration is equal to or greater than a limitation value, or equal to or less than a limitation value.

The different cycle decision apparatus 320 detects a state shown as "CASE4" in FIGS. 4D and 4G. Therefore, the different cycle decision apparatus 320 comprises a NAND gate NAND4 for performing a NAND (AND with negated output) operation of the data $MT_{R2}$ outputted from the second latch circuit group DF2 and the data $MT_{S1}$ outputted from the first latch circuit group DF1, a subtracter SUB4 for performing a subtraction between the data $MDAT_{R2}$ outputted from the second latch circuit group DF2 and the data $MDAT_{S1}$ outputted from the first latch circuit group DF1 (in this example, $MDAT_{R2}$ is subtracted from $MDAT_{S1}$), a comparator MC4 for comparing the subtracted result outputted from the subtracter SUB4 with a pulse duration limitation value $WMT_2$ supplied from a limitation value storage LMT, and a latch circuit DF7 for latching therein the comparison result output of the comparator MC4.

The NAND gate NAND4 detects that the integer delay signals $MT_{R2}$ and $MT_{S1}$ are present at the same time. That is, the integer delay signal $MT_{R2}$ becomes, as shown in FIG. 9C, logical H when a reset pulse $P_R$ is outputted before one period of the reference clock REFCLK, and the integer delay signal $MT_{S1}$ becomes logical H when a set pulse $P_S$ is outputted in the next period. When those conditions are satisfied, the NAND gate NAND4 outputs logical L to control the comparator MC4 to its operation mode. This state is shown in FIG. 4 as CASE4. In this example, there is shown a case that the odd value $MDAT_{S1}$ is 4 ns and $MDAT_{R2}$ is 4 ns. Therefore, as shown in FIG. 9, a time duration TRS from the falling timing of the previous test pattern signal TP to the rising timing of the next test pattern signal TP is 8+4−4=8 ns.

Namely, in the subtracter SUB4, one period (8 ns) of the reference clock REFCLK is added to the odd value $MDAT_{S1}$, and the odd value $MT_{R1}=4$ ns is subtracted from the added value (12 ns) to obtain $T_{RS}=8$ ns.

The comparator MC4 compares the time duration $T_{RS}=8$ ns with the limitation value $WMT_2$. If $T_{RS}<WMT_2$, logical H is outputted to indicate a set error. If $T_{RS}>WMT_2$, logical L is outputted and a normal set is indicated.

In the embodiments shown in FIGS. 3 and 7, the first set error detecting apparatus 200 and the second set error detecting apparatus 300 are separately shown to simplify the description. However, it could be easily understood that in reality, as shown in FIG. 10, a configuration having both of the first set error detecting apparatus 200 and the second set error detecting apparatus 300 is employed.

In the above embodiments, there have been described the cases in which the timing signal generating apparatus and the method of detecting any set error to a timing signal according to the present invention are used in an IC tester respectively. It is needless to say that the present invention can be applied to various types of timing signal generating apparatus themselves each for generating a timing signal based on a program, various types of devices, instruments, apparatus or equipments each using any one of such timing signal generating apparatus, and the like.

As described above, according to the present invention, in the case that set values for defining a rising timing and a falling timing of a test pattern signal are erroneously set in a test program so as to generate a test pattern signal having its pulse duration shorter than a predetermined pulse duration, such set error can be detected by the first set error detecting apparatus and the second set error detecting apparatus. Therefore, if the test program will be executed only once, the erroneous set state can be detected. Consequently, any erroneous set state can be detected in a short period of time, which results in a remarkable advantage that an analysis or elucidation of the state that, for example, the failure occurrence rate is abnormally high can be completed in a shot period of time.

Accordingly, if the present invention is applied to a timing signal generating apparatus of, for example, a semiconductor device testing apparatus, there is obtained an advantage that the efficiency of a test for semiconductor devices such as ICs can be improved, and thus, the effect of the present invention is very large when the present invention is practically used.

While the present invention has been described with regard to the preferred embodiments shown by way of example, it will be apparent to those skilled in the art that various modifications, alterations, changes, and/or minor improvements of the illustrated embodiments can be made without departing from the spirit and the scope of the present invention. Accordingly, it should be understood that the present invention is not limited to the embodiments shown and described above, and is intended to include such various modifications, alterations, changes, and/or minor improvements falling within the invention defined by the appended claims.

What is claimed is:

1. A timing signal generating apparatus for generating a set pulse and a reset pulse with a predetermined delay time between them on the basis of a program, and producing a logical signal having a predetermined level using these set pulse and reset pulse, said timing signal generating apparatus comprising:

a first set error detecting means for detecting a time duration from a timing at which the set pulse is generated until a timing at which the reset pulse is generated, and informing of a set error if the detected time duration is shorter than a predetermined limit value.

2. The timing signal generating apparatus according to claim 1, wherein said first set error detecting means detects a time duration from a timing at which the set pulse is generated until a timing at which the reset pulse is generated within the same one period of a reference clock, and generates a logical signal representing the set error if the detected time duration is shorter than a first predetermined limit value.

3. The timing signal generating apparatus according to claim 1, wherein said first set error detecting means detects a time duration from a timing at which the set pulse is generated until a timing at which the reset pulse is generated within adjacent periods of a reference clock, and generates a logical signal representing the set error if the detected time duration is shorter than a second predetermined limit value.

4. The timing signal generating apparatus according to claim 1, wherein said first set error detecting means comprises:

same cycle decision means for detecting a time duration from a timing at which the set pulse is generated until a timing at which the reset pulse is generated within the same one period of a reference clock, and determining whether the detected time duration is shorter than a first predetermined limit value or not;

different cycle decision means for detecting a time duration from a timing at which the set pulse is generated until a timing at which the reset pulse is generated within adjacent periods of the reference clock, and determining whether the detected time duration is shorter than a second predetermined limit value or not; and means for generating a logical signal representing the set error if the detected time duration by said same cycle decision means is shorter than the first predetermined limit value or if the detected time duration by said different cycle decision means is shorter than the second predetermined limit value.

5. A timing signal generating apparatus for generating a set pulse and a reset pulse with a predetermined delay time between them on the basis of a program, and producing a logical signal having a predetermined level using these set pulse and reset pulse, said timing signal generating apparatus comprising:

a second set error detecting means for detecting a time duration from a timing at which the reset pulse is generated until a timing at which the set pulse is generated, and informing of a set error if the detected time duration is shorter than a predetermined limit value.

6. The timing signal generating apparatus according to claim 5, wherein said second set error detecting means detects a time duration from a timing at which the reset pulse is generated until a timing at which the set pulse is generated within the same one period of a reference clock, and generates a logical signal representing the set error if the detected time duration is shorter than a first predetermined limit value.

7. The timing signal generating apparatus according to claim 5, wherein said second set error detecting means detects a time duration from a timing at which the reset pulse is generated until a timing at which the set pulse is generated within adjacent periods of a reference clock, and generates a logical signal representing the set error if the detected time duration is shorter than a second predetermined limit value.

8. The timing signal generating apparatus according to claim 5, wherein said second set error detecting means comprises:

same cycle decision means for detecting a time duration from a timing at which the reset pulse is generated until a timing at which the set pulse is generated within the same one period of a reference clock, and determining whether the detected time duration is shorter than a first predetermined limit value or not;

different cycle decision means for detecting a time duration from a timing at which the reset pulse is generated until a timing at which the set pulse is generated within adjacent periods of the reference clock, and determining whether the detected time duration is shorter than a second predetermined limit value or not; and means for generating a logical signal representing the set error if the detected time duration by said same cycle decision means is shorter than the first predetermined limit value or if the detected time duration by said different cycle decision means is shorter than the second predetermined limit value.

9. The timing signal generating apparatus according to claim 1, further including:

a second set error detecting means for detecting a time duration from a timing at which the reset pulse is generated until a timing at which the set pulse is generated, and informing of a set error if the detected time duration is shorter than a predetermined limit value.

10. The timing signal generating apparatus according to claim 9, wherein said second set error detecting means detects a time duration from a timing at which the reset pulse is generated until a timing at which the set pulse is generated within the same one period of a reference clock, and generates a logical signal representing the set error if the detected time duration is shorter than a first predetermined limit value.

11. The timing signal generating apparatus according to claim 9, wherein said second set error detecting means detects a time duration from a timing at which the reset pulse is generated until a timing at which the set pulse is generated within adjacent periods of a reference clock, and generates a logical signal representing the set error if the detected time duration is shorter than a second predetermined limit value.

12. The timing signal generating apparatus according to claim 9, wherein said second set error detecting means comprises:
    same cycle decision means for detecting a time duration from a timing at which the reset pulse is generated until a timing at which the set pulse is generated within the same one period of a reference clock, and determining whether the detected time duration is shorter than a first predetermined limit value or not;
    different cycle decision means for detecting a time duration from a timing at which the reset pulse is generated until a timing at which the set pulse is generated within adjacent periods of the reference clock, and determining whether the detected time duration is shorter than a second predetermined limit value or not; and
    means for generating a logical signal representing the set error if the detected time duration by said same cycle decision means is shorter than the first predetermined limit value or if the detected time duration by said different cycle decision means is shorter than the second predetermined limit value.

13. A semiconductor device testing apparatus in which a set pulse and a reset pulse are generated with a predetermined delay time between them from a timing signal generator on the basis of a program, a test pattern signal having a predetermined level is produced using these set pulse and reset pulse, and the test pattern signal is applied to a semiconductor device under test,
    said semiconductor device testing apparatus comprising:
    a first set error detecting means for detecting a time duration from a timing at which the set pulse is generated until a timing at which the reset pulse is generated, and informing of a set error if the detected time duration is shorter than a predetermined limit value.

14. The semiconductor device testing apparatus according to claim 13, wherein said first set error detecting means comprises:
    same cycle decision means for detecting a time duration from a timing at which the set pulse is generated until a timing at which the reset pulse is generated within the same one period of a reference clock, and determining whether the detected time duration is shorter than a first predetermined limit value or not;
    different cycle decision means for detecting a time duration from a timing at which the set pulse is generated until a timing at which the reset pulse is generated within adjacent periods of the reference clock, and determining whether the detected time duration is shorter than a second predetermined limit value or not; and
    means for generating a logical signal representing the set error if the detected time duration by said same cycle decision means is shorter than the first predetermined limit value or if the detected time duration by said different cycle decision means is shorter than the second predetermined limit value.

15. A semiconductor device testing apparatus in which a set pulse and a reset pulse are generated with a predetermined delay time between them from a timing signal generator on the basis of a program, a test pattern signal having a predetermined level is produced using these set pulse and reset pulse, and the test pattern signal is applied to a semiconductor device under test,
    said semiconductor device testing apparatus comprising:
    a second set error detecting means for detecting a time duration from a timing at which the reset pulse is generated until a timing at which the set pulse is generated, and informing of a set error if the detected time duration is shorter than a predetermined limit value.

16. The semiconductor device testing apparatus according to claim 15, wherein said second set error detecting means comprises:
    same cycle decision means for detecting a time duration from a timing at which the reset pulse is generated until a timing at which the set pulse is generated within the same one period of a reference clock, and determining whether the detected time duration is shorter than a first predetermined limit value or not;
    different cycle decision means for detecting a time duration from a timing at which the reset pulse is generated until a timing at which the set pulse is generated within adjacent periods of the reference clock, and determining whether the detected time duration is shorter than a second predetermined limit value or not; and
    means for generating a logical signal representing the set error if the detected time duration by said same cycle decision means is shorter than the first predetermined limit value or if the detected time duration by said different cycle decision means is shorter than the second predetermined limit value.

17. The semiconductor device testing apparatus according to claim 13, further including:
    a second set error detecting means for detecting a time duration from a timing at which the reset pulse is generated until a timing at which the set pulse is generated, and informing of a set error if the detected time duration is shorter than a predetermined limit value.

18. The semiconductor device testing apparatus according to claim 17, wherein said second set error detecting means comprises:
    same cycle decision means for detecting a time duration from a timing at which the reset pulse is generated until a timing at which the set pulse is generated within the same one period of a reference clock, and determining whether the detected time duration is shorter than a first predetermined limit value or not;
    different cycle decision means for detecting a time duration from a timing at which the reset pulse is generated until a timing at which the set pulse is generated within adjacent periods of the reference clock, and determining whether the detected time duration is shorter than a second predetermined limit value or not; and means for generating a logical signal representing the set error if the detected time duration by said same cycle decision means is shorter than the first predetermined limit value or if the detected time duration by said different cycle decision means is shorter than the second predetermined limit value.

19. A method of detecting any set error to a timing signal comprising the steps of:
  generating a set pulse and a reset pulse at predetermined timings on the basis of a program;
  producing a logical signal having a predetermined level using these set pulse and reset pulse;
  detecting a time duration from a timing at which the set pulse is generated until a timing at which the reset pulse is generated; and
  informing of a set error if the detected time duration is shorter than a predetermined limit value.

20. The method according to claim 19, wherein
  said time duration detecting step includes a step of detecting a time duration from the timing at which the set pulse is generated until the timing at which the reset pulse is generated within the same one period of a reference clock, and
  said set error informing step includes the steps of:
    determining whether the detected time duration is shorter than a first predetermined limit value or not; and
    generating a logical signal representing the set error if the detected time duration is shorter than the first predetermined limit value.

21. The method according to claim 19, wherein
  said time duration detecting step includes a step of detecting a time duration from the timing at which the set pulse is generated until the timing at which the reset pulse is generated within adjacent periods of a reference clock, and
  said set error informing step includes the steps of:
    determining whether the detected time duration is shorter than a second predetermined limit value or not; and
    generating a logical signal representing the set error if the detected time duration is shorter than the second predetermined limit value.

22. A method of detecting any set error to a timing signal comprising the steps of:
  generating a set pulse and a reset pulse at predetermined timings on the basis of a program;
  producing a logical signal having a predetermined level using these set pulse and reset pulse;
  detecting a time duration from a timing at which the reset pulse is generated until a timing at which the set pulse is generated; and
  informing of a set error if the detected time duration is shorter than a predetermined limit value.

23. The method according to claim 22, wherein
  said time duration detecting step includes a step of detecting a time duration from the timing at which the reset pulse is generated until the timing at which the set pulse is generated within the same one period of a reference clock, and
  said set error informing step includes the steps of:
    determining whether the detected time duration is shorter than a first predetermined limit value or not; and
    generating a logical signal representing the set error if the detected time duration is shorter than the first predetermined limit value.

24. The method according to claim 22, wherein
  said time duration detecting step includes a step of detecting a time duration from the timing at which the reset pulse is generated until the timing at which the set pulse is generated within adjacent periods of a reference clock, and
  said set error informing step includes the steps of:
    determining whether the detected time duration is shorter than a second predetermined limit value or not; and
    generating a logical signal representing the set error if the detected time duration is shorter than the second predetermined limit value.

25. A method of detecting any set error to a timing signal comprising the steps of:
  generating a set pulse and a reset pulse at predetermined timings on the basis of a program;
  producing a logical signal having a predetermined level using these set pulse and reset pulse;
  detecting a pulse duration of said logical signal from a timing at which the set pulse is generated until a timing at which the reset pulse is generated;
  informing of a first set error if the detected pulse duration is shorter than a predetermined limit value;
  detecting a time duration from a timing at which the reset pulse is generated until a timing at which the set pulse is generated; and
  informing of a second set error if the detected time duration is shorter than a second predetermined limit value.

26. The method according to claim 25, wherein
  said pulse duration detecting step includes the steps of:
    detecting a pulse duration from the timing at which the set pulse is generated until the timing at which the reset pulse is generated within the same one period of a reference clock; and
    detecting a pulse duration from the timing at which the set pulse is generated until the timing at which the reset pulse is generated within adjacent periods of the reference clock;
  said time duration detecting step includes the steps of:
    detecting a time duration from the timing at which the reset pulse is generated until the timing at which the set pulse is generated within the same one period of the reference clock; and
    detecting a time duration from the timing at which the reset pulse is generated until the timing at which the set pulse is generated within adjacent periods of the reference clock;
  said first set error informing step includes the steps of:
    determining whether or not the detected pulse duration is shorter than a first predetermined limit value or a second predetermined limit value; and
    generating a logical signal representing the first set error if the detected pulse duration is shorter than the first predetermined limit value or the second predetermined limit value; and
  said second set error informing step includes the steps of:
    determining whether or not the detected time duration is shorter than a first predetermined limit value or a second predetermined limit value; and
    generating a logical signal representing the second set error if the detected time duration is shorter than the first predetermined limit value or the second predetermined limit value.

* * * * *